US009659912B2

United States Patent
Bayerer et al.

(10) Patent No.: US 9,659,912 B2
(45) Date of Patent: May 23, 2017

(54) LOW-INDUCTANCE CIRCUIT ARRANGEMENT COMPRISING LOAD CURRENT COLLECTING CONDUCTOR TRACK

(71) Applicant: Infineon Technologies AG, Neubiberg (DE)

(72) Inventors: Reinhold Bayerer, Reichelsheim (DE); Waleri Brekel, Anröchte (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/830,446

(22) Filed: Aug. 19, 2015

(65) Prior Publication Data

US 2016/0056132 A1    Feb. 25, 2016

(30) Foreign Application Priority Data

Aug. 20, 2014    (DE) .................. 10 2014 111 931

(51) Int. Cl.
*H01L 25/07*    (2006.01)
*H01L 23/498*    (2006.01)
(Continued)

(52) U.S. Cl.
CPC ........ *H01L 25/072* (2013.01); *H01L 23/3735* (2013.01); *H01L 23/49811* (2013.01);
(Continued)

(58) Field of Classification Search
CPC . H01L 25/072; H01L 24/49; H01L 23/49844; H01L 23/29822;
(Continued)

(56) References Cited

U.S. PATENT DOCUMENTS 9,230,889 B2 * 1/2016 Otremba ................. H01L 21/56
9,391,055 B2 * 7/2016 Romas, Jr. .............. H01L 25/18
(Continued)

FOREIGN PATENT DOCUMENTS

DE      3937045 A1    5/1991
DE      10037533 C1   1/2002
(Continued)

*Primary Examiner* — Alexander Oscar Williams
(74) *Attorney, Agent, or Firm* — Murphy, Bilak & Homiller, PLLC

(57) ABSTRACT

A circuit arrangement includes at least two semiconductor chip having first and second load terminals that are each connected to one another, a first load current collecting conductor track, and also an external terminal electrically conductively connected thereto. For each of the semiconductor chips there is at least one electrical connection conductor electrically conductively connected to the first load terminal of the relevant semiconductor chip and also to the first load current collecting conductor track. The total inductance of all the connection conductors with which the first load terminal of the second of the semiconductor chips is connected to the first load current collecting conductor track has at least twice the inductance of that section of the first load current collecting conductor track which is formed between the second connection location of the first of the semiconductor chips and the second connection location of the second of the semiconductor chips.

27 Claims, 12 Drawing Sheets

(51) Int. Cl.
*H01L 23/053* (2006.01)
*H01L 23/00* (2006.01)
*H01L 23/373* (2006.01)

(52) U.S. Cl.
CPC .. *H01L 23/49822* (2013.01); *H01L 23/49833* (2013.01); *H01L 23/49844* (2013.01); *H01L 23/49894* (2013.01); *H01L 24/49* (2013.01); H01L 23/053 (2013.01); H01L 2224/04042 (2013.01); H01L 2224/0603 (2013.01); H01L 2224/32225 (2013.01); H01L 2224/45014 (2013.01); H01L 2224/48137 (2013.01); H01L 2224/48139 (2013.01); H01L 2224/48227 (2013.01); H01L 2224/48472 (2013.01); H01L 2224/4903 (2013.01); H01L 2224/49109 (2013.01); H01L 2224/49111 (2013.01); H01L 2224/49113 (2013.01); H01L 2224/49175 (2013.01); H01L 2224/73265 (2013.01); H01L 2924/00014 (2013.01); H01L 2924/1301 (2013.01); H01L 2924/13055 (2013.01); H01L 2924/13062 (2013.01); H01L 2924/13091 (2013.01); H01L 2924/19107 (2013.01); H01L 2924/30107 (2013.01)

(58) Field of Classification Search
CPC ......... H01L 23/29894; H01L 23/39833; H01L 23/053; H01L 2924/13055; H01L 2924/13091; H01L 2924/13062; H01L 2924/1301; H01L 2924/30207; H01L 2224/48137; H01L 2224/48227; H01L 27/07; H01L 23/498; H01L 23/00; H01L 23/49822; H01L 23/49894; H01L 23/49833; H01L 2924/12062; H01L 2924/30107; H01L 34/053
USPC ........ 257/683, 784, 690, 691, 696, 698, 786
See application file for complete search history.

(56) References Cited

U.S. PATENT DOCUMENTS

2015/0069463 A1\* 3/2015 Hartmann ............... H01L 24/49
257/139
2016/0211246 A1\* 7/2016 Akiyama ............ H01L 21/8213

FOREIGN PATENT DOCUMENTS

| DE | 69233450 T2 | 12/2005 |
| DE | 60032651 T2 | 10/2007 |
| DE | 102010006850 A1 | 8/2011 |
| EP | 0277546 A1 | 8/1988 |
| WO | 9629737 A1 \* | 9/1996 |

\* cited by examiner

E11-E11

E12-E12

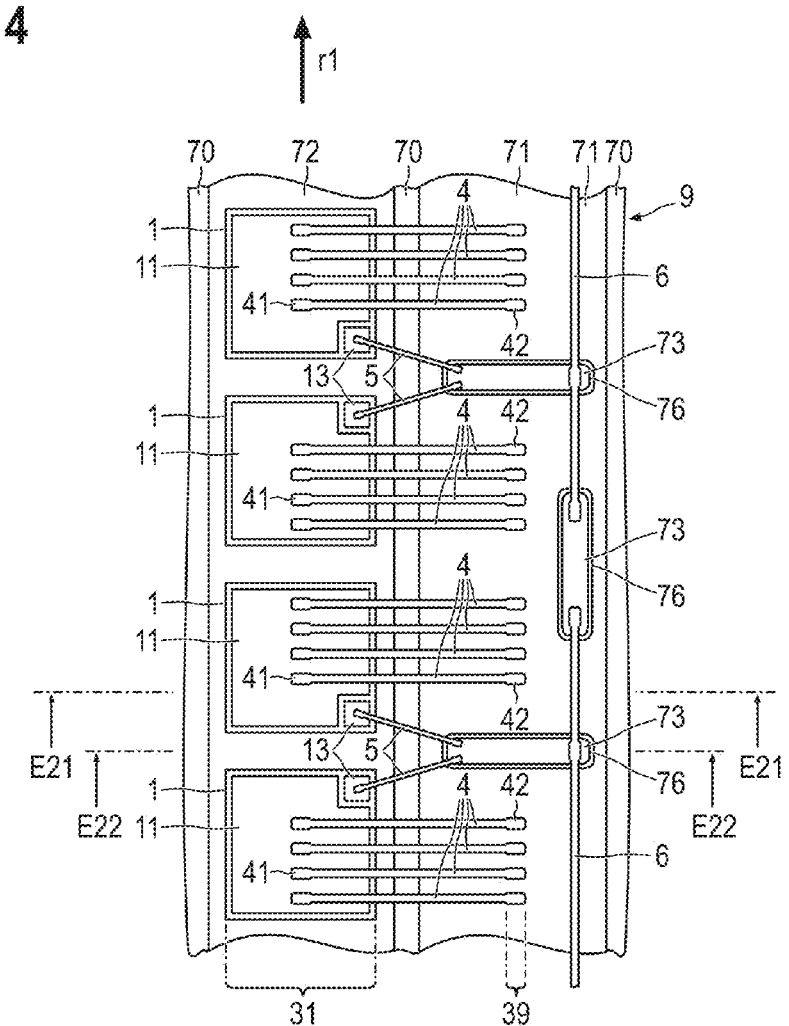
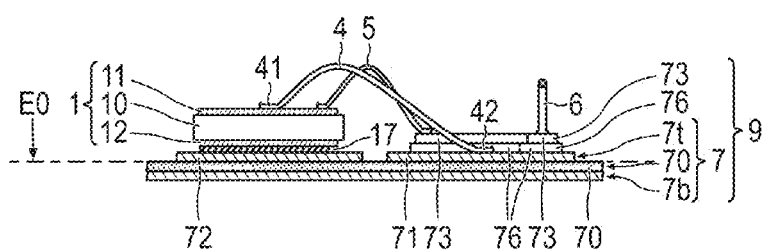
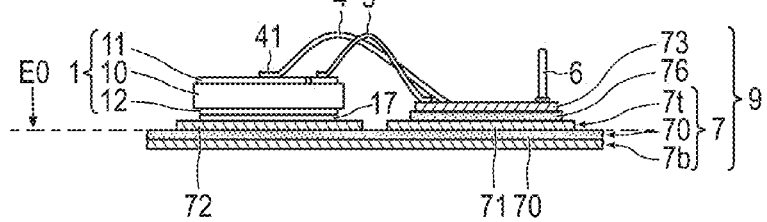

E31-E31

E32-E32

E41-E41

E42-E42

E51-E51

E52-E52

E61-E61

E62-E62

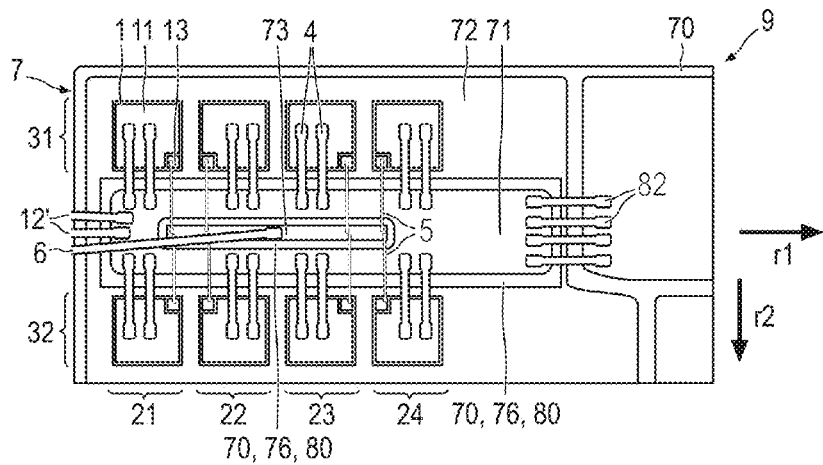
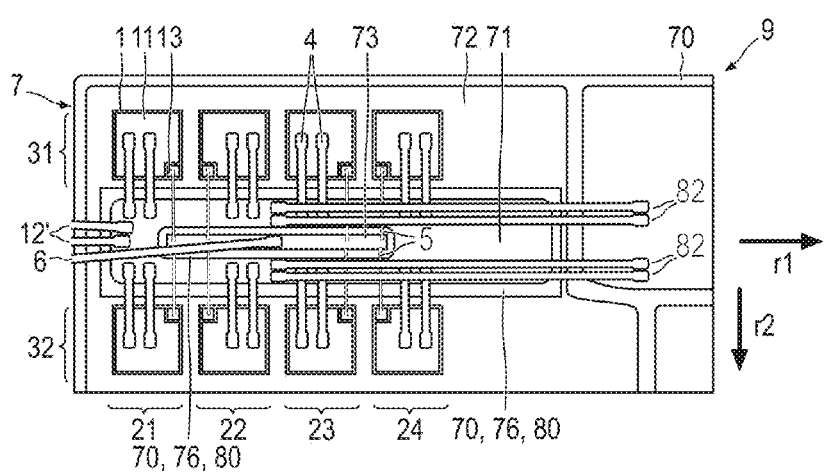
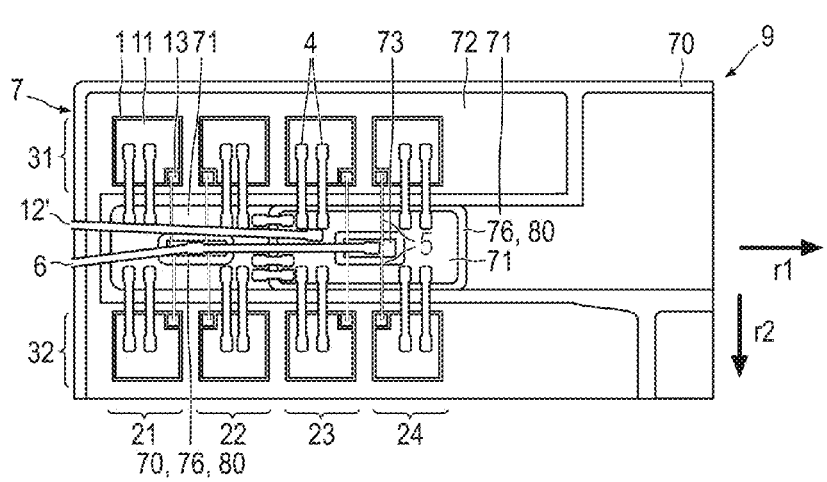

LOW-INDUCTANCE CIRCUIT ARRANGEMENT COMPRISING LOAD CURRENT COLLECTING CONDUCTOR TRACK

PRIORITY CLAIM

This application claims priority to German Patent Application No. 10 2014 111 931.2 filed on 20 Aug. 2014, the content of said application incorporated herein by reference in its entirety.

BACKGROUND

The present invention relates to a circuit arrangement wherein two or more semiconductor chips are electrically connected in parallel in order to be able to process higher load currents. The parallel connection is usually carried out, inter alia, by means of one or a plurality of bonding wires routed completely or substantially (e.g., by conductor track support points which are situated between adjacent semiconductor chips and to which the bonding wires are bonded)—optionally from chip top side to chip top side. Rapid changes in the load current such as those occurring during switching processes, for example, can lead to undesirably high induced voltages on account of unavoidable inductances of the bonding wires and other electrical connection conductors of the semiconductor chips connected in parallel. This holds true particularly if a large number of semiconductor chips are intended to be connected in parallel. By way of example, semiconductor chips based on the basic semiconductor material silicon carbide (SiC) or gallium nitride (GaN) are often manufactured with a small basic chip area in order to avoid losses of yield. This has the consequence that, in order to obtain a desired current-carrying capacity of the circuit arrangement, a large number of semiconductor chips operated synchronously must be connected in parallel since the current-carrying capacity of semiconductor chips decreases as the basic chip area decreases (for an identical or similar chip construction). In general, however, the arrangement of many chips and associated connection lines results in a high leakage inductance and asymmetrical operation of the semiconductor chips of a parallel connection in the sense that the load currents of different semiconductor chips of the parallel connection differ significantly.

One measure for keeping down the inductance of such a parallel connection consists of arranging the parallel-connected semiconductor chips in a series that runs perpendicular to the main current direction of the circuit arrangement. In the case of small semiconductor chips (basic area less than or equal to 40 mm$^2$, less than or equal to 25 mm$^2$ or less than or equal to 10 mm$^2$), achieving a high current intensity (e.g., 400 A to 3000 A or higher) necessitates a very high number of semiconductor chips to be connected in parallel, for example IGBTs, which are connected in parallel and are operated simultaneously with identical switching states. In the example with the IGBTs connected in parallel, freewheeling diodes with respect to the IGBTs should not be regarded as "connected in parallel with the IGBTs" since they are not operated simultaneously with the IGBTs with identical switching states. If all the semiconductor chips to be connected in parallel were arranged in a series, this would result in a very short power semiconductor module having an extremely large width, but this is not always attractive because it contravenes geometrical boundary conditions of the devices.

SUMMARY

The object of the present invention is to provide a circuit arrangement which, particularly for small semiconductor chips having a permissible current intensity of approximately 15 A to 40 A per semiconductor chip, has a low-inductance parallel connection of semiconductor chips with acceptable uniform distribution of the load current that flows through the circuit arrangement among the individual semiconductor chips.

According to a first embodiment, a circuit arrangement having a number of at least two semiconductor chips arranged one behind another in a series extending in a first lateral direction is disclosed. Each of the semiconductor chips has a semiconductor body, and also a first load terminal and a second load terminal. The first load terminals of all the semiconductor chips are electrically conductively connected to one another, and the second load terminals of all the semiconductor chips are likewise electrically conductively connected to one another. In addition, the circuit arrangement includes a first load current collecting conductor track. For each of the semiconductor chips there is at least one electrical connection conductor having a first connection location, at which the relevant connection conductor is electrically conductively connected to the first load terminal, and also a second connection location, at which the relevant connection conductor is electrically conductively connected to the first load current collecting conductor track. An external terminal of the circuit arrangement is electrically conductively connected to the first load current collecting conductor track. In this case, it holds true that for each first and second of the semiconductor chips whose second connection locations form directly adjacent second connection locations among all the latter along the first load current collecting conductor track and are arranged with respect to one another such that the second connection location of the first of the semiconductor chips is situated along the first load current collecting conductor track between the second connection location of the second of the semiconductor chips and the external terminal, the total inductance of all the connection conductors with which the first load terminal of the second of the semiconductor chips is connected to the first load current collecting conductor track has at least twice the inductance of that section of the first load current collecting conductor track which is formed between the second connection location of the first of the semiconductor chips and the second connection location of the second of the semiconductor chips.

According to a second embodiment, a first circuit arrangement and a second circuit arrangement, which are embodied in each case according to a circuit arrangement in accordance with the first embodiment is disclosed. The first load terminals of the semiconductor chips of the first circuit arrangement are permanently electrically conductively connected to the second load terminals of the semiconductor chips of the second circuit arrangement. By way of example, low-inductance bridge circuits can be realized thereby.

While in conventional circuit arrangements the load current through the parallel-connected semiconductor chips among the latter is completely or substantially collected by one or a plurality of series-connected bonding wires which by their nature have a high inductance, in the present embodiments, the load current is collected by a first load current collecting conductor track, to which the first load terminals are connected in each case with the aid of one or a plurality of connection conductors. On account of this construction, the connection conductors can be kept very short and thus with low inductance.

Furthermore, the load current of the parallel connection, just like in the case of conventional parallel connections, is formed by the sum of the load currents of the individual semiconductor chips, but in arrangements according to the present invention the load current of each semiconductor chip is firstly tapped off by one or a plurality of connection conductors electrically connected in parallel (e.g., one or a plurality of bonding wires electrically connected in parallel) and is fed to the first load current collecting conductor track. As a result, although the load current of a semiconductor chip flows through the connection conductor or connection conductors with which the first load terminal of the relevant semiconductor chip is connected to the load current collecting conductor track, said load current does not flow through connection conductors with which the first load terminal of other semiconductor chips of the parallel connection is connected to the load current collecting conductor track. Therefore, a change in the load current through the relevant semiconductor chip does not bring about an induced voltage originating from the inductances of the connection conductors with which the first load terminal or the first load terminals of the or of the other semiconductor chips of the parallel connection is or are connected to the load current collecting conductor track.

The invention is explained in greater detail below on the basis of exemplary embodiments with reference to the accompanying figures. In the figures, identical reference signs designate identical or identically acting elements. In the figures:

FIG. 1 shows a plan view of a section of a first example of a circuit arrangement comprising a plurality of semiconductor chips arranged in a series.

FIG. 2 shows a cross section through the section of a circuit arrangement in accordance with FIG. 1 in a sectional plane E11-E11.

FIG. 3 shows a cross section through the section of the circuit arrangement in accordance with FIG. 1 in a sectional plane E12-E12.

FIG. 4 shows a plan view of a section of a second example of a circuit arrangement comprising a plurality of semiconductor chips arranged in a series.

FIG. 5 shows a cross section through the section of the circuit arrangement in accordance with FIG. 4 in a sectional plane E21-E21.

FIG. 6 shows a cross section through the section of the circuit arrangement in accordance with FIG. 4 in a sectional plane E22-E22.

FIG. 7 shows a plan view of a section of a third example of a circuit arrangement comprising a plurality of semiconductor chips arranged in a series.

FIG. 8 shows a cross section through the section of the circuit arrangement in accordance with FIG. 7 in a sectional plane E31-E31.

FIG. 9 shows a cross section through the section of the circuit arrangement in accordance with FIG. 7 in a sectional plane E32-E32.

FIG. 10 shows a plan view of a section of a fourth example of a circuit arrangement having a plurality of semiconductor chips arranged in a series.

FIG. 11 shows a cross section through the section of the circuit arrangement in accordance with FIG. 10 in a sectional plane E41-E41.

FIG. 12 shows a cross section through the section of the circuit arrangement in accordance with FIG. 10 in a sectional plane E42-E42.

FIG. 13 shows a plan view of a section of a fifth example of a circuit arrangement comprising a plurality of semiconductor chips arranged in a series.

FIG. 14 shows a cross section through the section of the circuit arrangement in accordance with FIG. 13 in a sectional plane E51-E51.

FIG. 15 shows a cross section through the section of the circuit arrangement in accordance with FIG. 13 in a sectional plane E52-E52.

FIG. 16 shows a plan view of a section of a sixth example of a circuit arrangement comprising a plurality of semiconductor chips arranged in a series.

FIG. 17 shows a cross section through the section of the circuit arrangement in accordance with FIG. 16 in a sectional plane E61-E61.

FIG. 18 shows a cross section through the section of the circuit arrangement in accordance with FIG. 16 in a sectional plane E62-E62.

FIG. 19 shows an equivalent circuit diagram of the wiring of a parallel connection of a plurality of semiconductor chips according to the present invention.

FIG. 20 shows a graphic for elucidating the term "series".

FIG. 21 shows a perspective view of a section of a circuit carrier of a semiconductor module having a construction in accordance with the fifth example (FIGS. 13 to 15).

FIG. 22 shows a plan view of a half-bridge circuit.

FIG. 23 shows a plan view of a half-bridge circuit that differs from the half-bridge circuit in accordance with FIG. 22 merely in the wiring of the control terminals.

FIG. 24 shows a plan view of a section of a parallel connection of a plurality of semiconductor chips.

FIG. 25 shows a plan view of a section of a further parallel connection of a plurality of semiconductor chips.

FIG. 26 shows a plan view of a section of yet another parallel connection of a plurality of semiconductor chips.

FIG. 27 shows a perspective view of an opened power semiconductor module.

FIG. 28 shows the closed power semiconductor module in accordance with FIG. 27.

FIG. 29 shows a plan view of a section of a first example of a circuit arrangement comprising a plurality of semiconductor chips arranged in a series.

FIG. 30 shows a plan view of a section of a first example of a circuit arrangement comprising a plurality of semiconductor chips arranged in a series.

Figure 1:
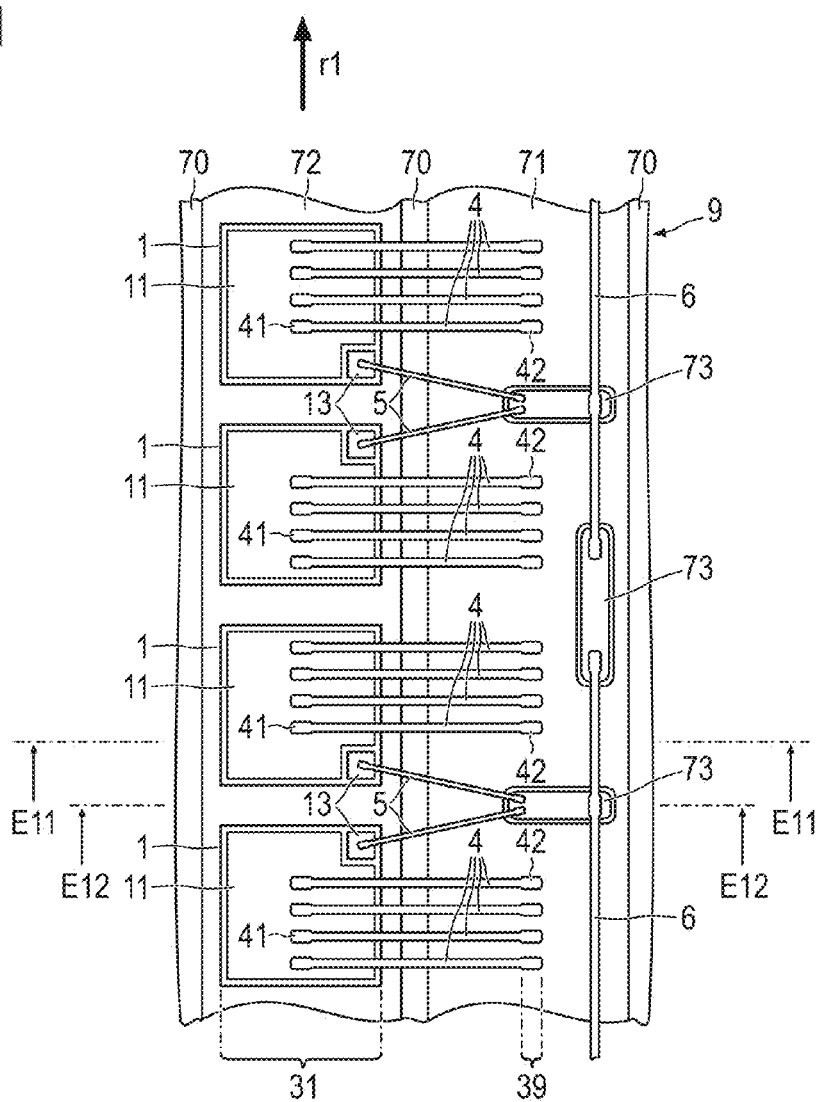
FIG. 1 shows a plan view of a section of a power semiconductor module.

As is illustrated in FIG. 1, a circuit arrangement comprises at least two (four here merely by way of example) semiconductor chips 1 arranged one behind another in a first series 31 on a flat circuit carrier 9. The first series 31 extends in a first lateral direction r1 running substantially parallel to the circuit carrier 9. Each of the semiconductor chips 1 has a semiconductor body 10, and also a first load terminal 11 and a second load terminal 12. The first load terminal 11 is situated in each case on that side of the semiconductor body 10 which faces away from the circuit carrier 9.

Figure 2:
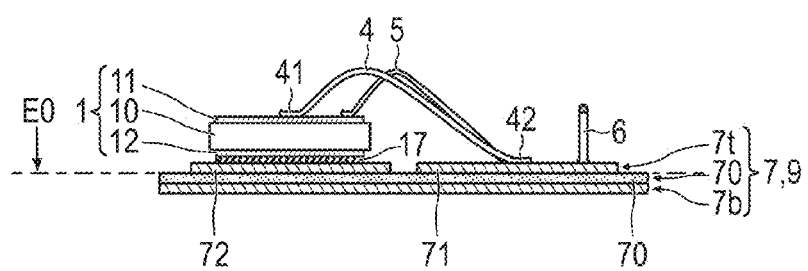
FIG. 2 shows a cross section in a sectional plane E11-E11 and FIG. 3 shows a cross section in a sectional plane E12-E12.
Figure 3:
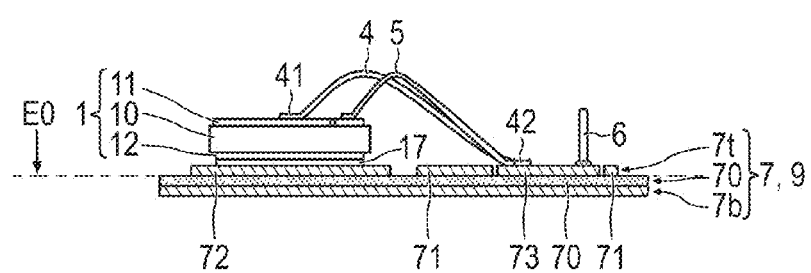

As is evident from FIGS. 2 and 3, in the case of such a semiconductor chip 1 the first load terminal 11 and the second load terminal 12 can be arranged on mutually opposite sides of the semiconductor body 10. In this case, the second load terminal 12 can be arranged on that side of the semiconductor body 10 which faces the circuit carrier 9.

In such a semiconductor chip 1, an arbitrary semiconductor component can be integrated, for example a diode, or a controllable semiconductor component such as e.g., a MOSFET, an IGBT, a JFET, a thyristor, etc. In any case a semiconductor chip 1 has a first load terminal 11 and a second load terminal 12, and optionally a control terminal 13, which—as illustrated in FIGS. 1 and 3—can be arranged on that side of the semiconductor body 10 which faces away from the circuit carrier 9. It is likewise possible, however, to arrange such a control terminal 13 on that side of the semiconductor body 10 which faces the circuit carrier 9. The semiconductor component has a load path which is formed between the first load terminal 11 and the second load terminal 12 and via which a load current flows during the operation. If the semiconductor component is a controllable semiconductor component, the load current can be controlled by a control signal being applied to the control terminal.

The first and second load terminals 11, 12 and, if present, the control terminal 13 can be in each case a contact pad, e.g., a metallization layer, which is applied to the semiconductor body 10. Such contact pads are applied to the semiconductor body 10 of the semiconductor chip 1 during the production thereof. Thus, the first and second load terminals 11, 12 and, if present, the control terminal 13 are part of the semiconductor chip 1 already before the semiconductor chip 1 is mounted on the circuit carrier 9.

Depending on the type of the semiconductor component realized in a semiconductor chip 1, the first and second load terminals 11 and 12 can be e.g., anode and cathode, cathode and anode, source and drain, drain and source, emitter and collector, or collector and emitter. A control terminal can be a gate terminal or a base terminal, for example.

The semiconductor body 10 of a semiconductor chip 1 can comprise an arbitrary basic semiconductor material, for example silicon, silicon carbide, gallium nitride, gallium arsenide, etc.

In principle, the semiconductor chips 1 arranged one behind another in the first series 31 can be constructed arbitrarily. Semiconductor chips 1 containing arbitrary semiconductor components—of identical type and/or of different types—can be combined. In particular, the semiconductor chips 1 arranged in the first series 31 can contain in each case a controllable semiconductor component (e.g., an IGBT, a MOSFET, or a JFET) and be interconnected such that they can be operated in common-mode operation, for example by their load paths being able to be switched on simultaneously and switched off simultaneously. In this sense, "common-mode operation" and "simultaneously" include minimal deviations from common-mode operation which are caused by inductances and/or conduction resistances and/or different control behavior of different semiconductor components. In accordance with one embodiment of the invention, the semiconductor chips 1 of the first series 31 can be constructed identically.

As can be gathered from FIG. 1, in particular, the first load terminals 11 of all the semiconductor chips 1 are electrically conductively connected to one another. For this purpose, the circuit carrier 9 has a first load current collecting conductor track 71, to which each of the first load terminals 11 is electrically conductively connected, in each case by means of one or a plurality of connection conductors 4. Each of the connection conductors 4 has a first connection location 41, at which it is electrically conductively connected to the first load terminal 11, and also a second connection location 42, at which it is electrically conductively connected to the first load current collecting conductor track 71.

The connection conductors 6 can be bonding wires, for example, which are bonded directly to the first load terminal 11 at the first connection location 41 and directly to the first load current collecting conductor track 71 at the second connection location 42 in each case by wire bonding. Within the meaning of the present invention, bonding wires are considered to be both those which (outside bonding locations) have a circular cross section and those which have a non-circular cross section. As an example of bonding wires having a non-circular cross section, mention shall be made of so-called "ribbons", which have an elongate, for example approximately rectangular, cross section outside bonding locations. Alternatively, the connection conductors 6 can be angled metal plates, for example, which are electrically conductively connected directly to the first load terminal 11 at the first connection location 41 and directly to the first load current collecting conductor track 71 at the second connection location 42 in each case by means of an electrically conductive soldering, sintering, welding or adhesive-bonding connection.

Optionally, the second connection locations 42, as in all other embodiments of the invention, can be arranged one behind another in a series running in the first lateral direction r1 and thus parallel to the first series 31.

Furthermore, the second load terminals 12 of all the semiconductor chips 1 are also electrically conductively connected to one another. For this purpose, the circuit carrier 9 has a second load current collecting conductor track 72, to which each of the second load terminals 12 is electrically conductively connected. For this purpose, the semiconductor chips 1 of the first series 31 can be arranged on the second load current collecting conductor track 72, for example. As is illustrated in FIGS. 2 and 3, the semiconductor chips 1 can be electrically conductively connected to the second load current collecting conductor track 72 at their second load terminal 12 in each case by means of a planar connection layer 17, for example a solder layer, e.g., a diffusion solder layer, a layer comprising sintered metal powder (e.g., a silver powder), or an electrically conductive adhesive. For this purpose, the second load terminal 12 can be arranged in each case on that side of the semiconductor body 10 which faces the second load current collecting conductor track 72, and the connection layer 17 can be situated between the second load terminal 12 and the second load current collecting conductor track 72.

Insofar as a semiconductor chip 1 contains a controllable semiconductor component and accordingly has a control terminal 13, the latter can be electrically connected by means of a connection conductor 5, for example a bonding wire. Optionally, two, more than two or all of the semiconductor chips 1 can have in each case a control terminal 13 that is electrically conductively connected to the control terminals 13 of the other semiconductor chips 1. As is shown in the example in accordance with FIGS. 1, 2 and 3, the corresponding electrically conductive connection can be effected via the connection conductors 5, control signal conductor tracks 73 of the circuit carrier 9, and also one or a plurality of bonding wires 6. "Control signal conductor tracks" should be understood to be conductor tracks via which a control signal (that is to say e.g., a gate voltage) can be fed to the control terminals 13. The bonding wires 5 are in each case bonded to a control terminal 13 at a first bonding location and to a control signal conductor track 73 at a second bonding location. The bonding wires 6 are in each case bonded to one control signal conductor track 73 at a first bonding location and to another control signal conductor track 73 at a second bonding location.

In the figures, the bonding locations of the bonding wires 4, 5 and 6 are illustrated as locally widened since the bonding wire is locally crimped there during the bonding process. The formulation that a bonding wire is bonded to an object (e.g., a first load terminal 11, a control terminal 13, a conductor track 71, 72, 73) states that the relevant connection was produced by wire bonding, that is to say that the bonding wire directly contacts the relevant object. The relevant bonding connection can be free of solder in this case.

Figure 7:
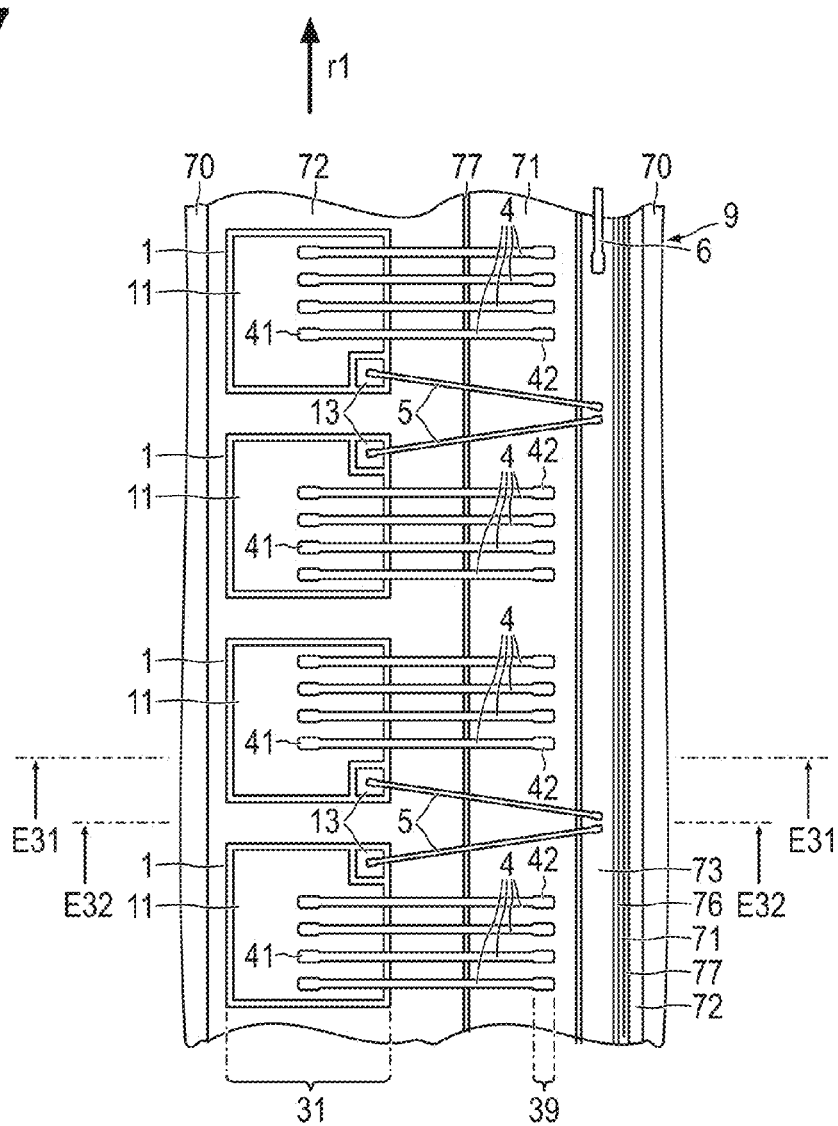
Figure 8:
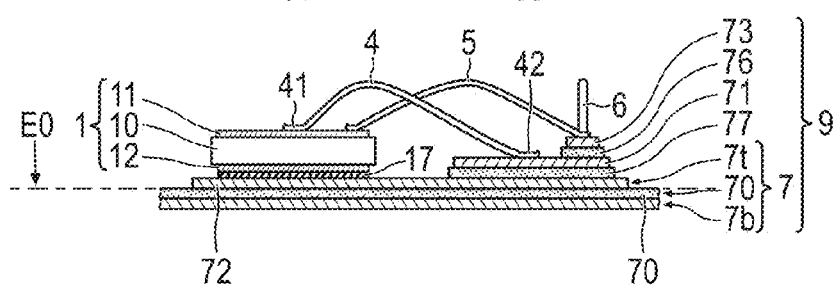
Figure 9:
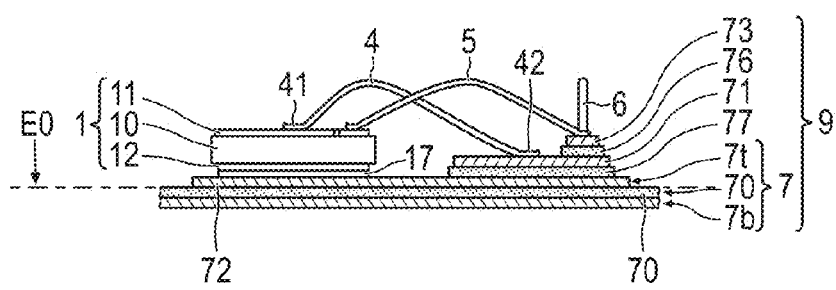
Figure 10:
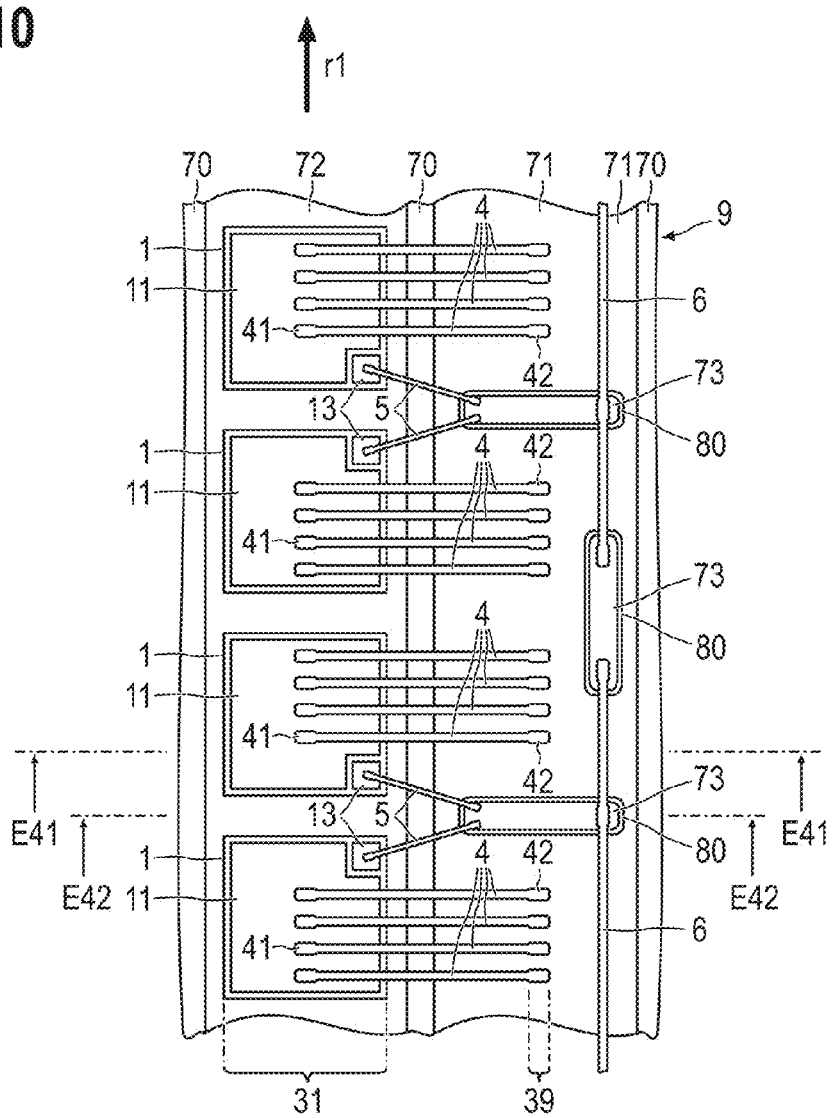
Figure 11:
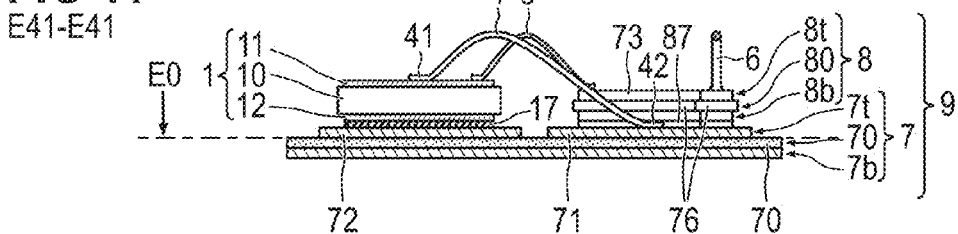
Figure 12:
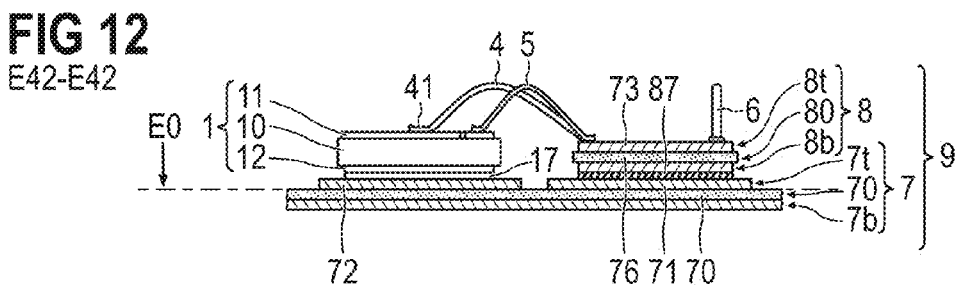
Figure 16:
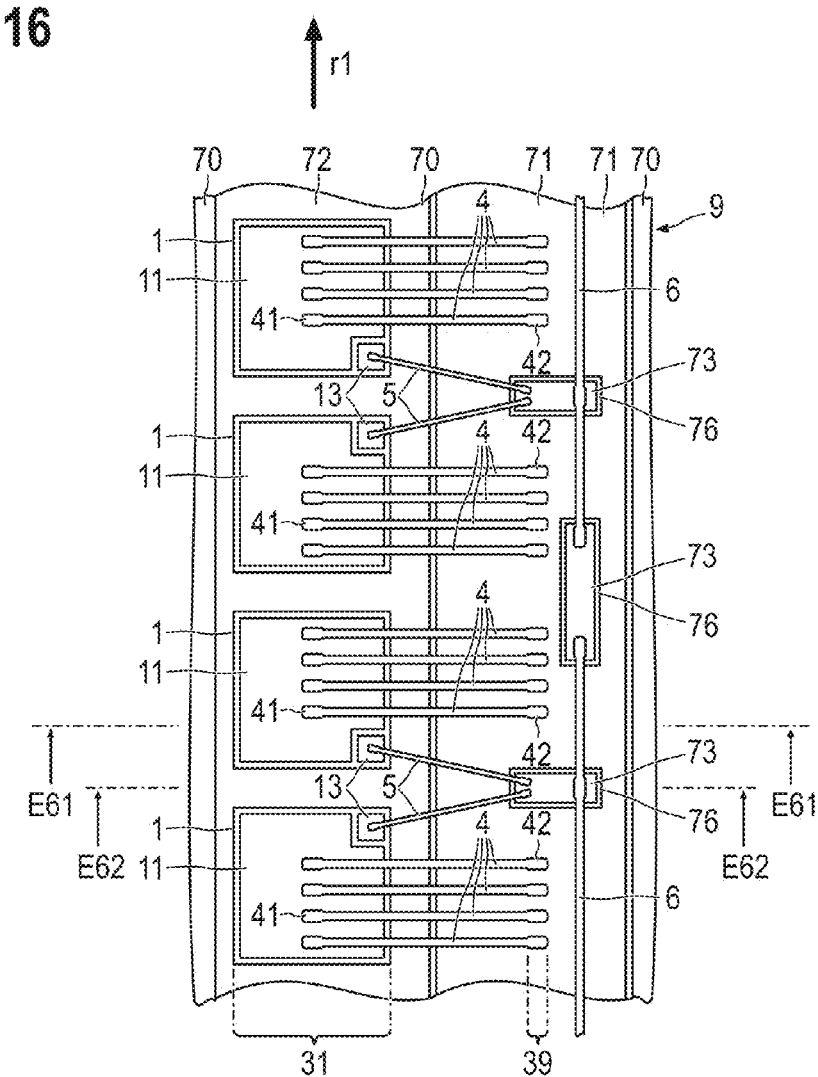
Figure 17:
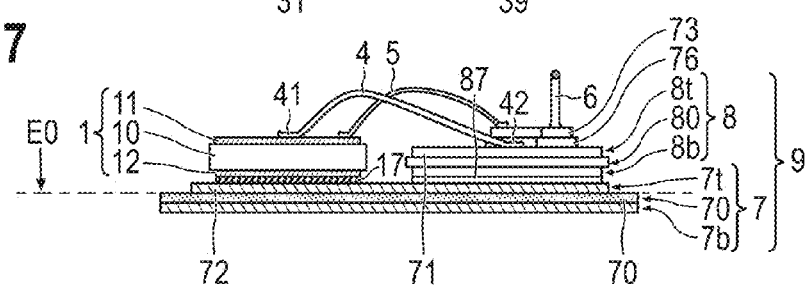
Figure 18:
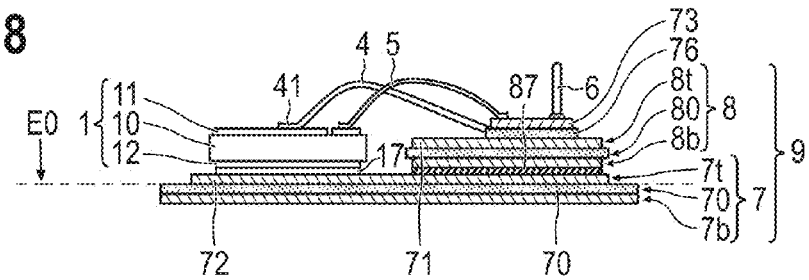

The further exemplary embodiments described with reference to FIGS. 4 to 18 have the same basic construction described with reference to FIGS. 1 to 3. The difference between the first example (FIGS. 1 to 3), the second example (FIGS. 4 to 6), the third example (FIGS. 7 to 9), the fourth example (FIGS. 10 to 12), the fifth example (FIGS. 13 to 15) and the sixth example (FIGS. 16 to 18) consists merely in the construction of the circuit carrier 9.

In the first example (FIGS. 1 to 3) the circuit carrier 9 comprises a printed circuit board 7 having a dielectric insulation carrier 70, which is provided with a structured upper metallization layer 7*t* on a top side, and also with a lower metallization layer 7*b* on an underside opposite to the top side. The first load current collecting conductor track 71, the second load current collecting conductor track 72 and the control signal conductor tracks 73 are embodied as sections of the upper metallization layer 7*t*, spaced apart from one another. The lower metallization layer 7*b*, as also in all other embodiments of the invention, can be structured or unstructured. Likewise in all other embodiments of the invention as well, the lower metallization layer 7*b* can be electrically connected to ground. An unstructured metallization layer 7*b* or a structuring which produces in the metallization layer 7*b* at least one whole-area conductor track mirrored with respect to the conductor track 71 relative to the insulation carrier 70 results in a very low inductance of at least and in particular the first load current collecting conductor track 71. For the case where the metallization layer 7*b* is formed over the whole area or structured at least such that a whole-area conductor track also arises in a mirror-inverted fashion with respect to the conductor track 72 relative to the insulation carrier 70, a low inductance can be achieved in the second load current collecting conductor track 72 as well.

In the second example (FIGS. 4 to 6), the control signal conductor tracks 73 of the circuit carrier 9 are arranged on the first load current collecting conductor track 71, i.e., on that side of the first load current collecting conductor track 71 which faces away from the insulation carrier 70. In order to electrically insulate the control signal conductor tracks 73 from the first load current collecting conductor track 71, a dielectric layer 76 is in each case arranged between them. The dielectric layer 76 can be for example a layer composed of or comprising ceramic, glass, plastic (e.g., an imide) or some other electrically insulating material.

In order to produce this arrangement, the dielectric layer 76 and the control signal conductor tracks 73 can be applied to the printed circuit board 7 after the production of the printed circuit board 7 (having the insulation carrier 70, the lower metallization layer 7*b* and the upper metallization layer 7*t*). It is likewise possible, however, for the dielectric layer 76 and the control signal conductor tracks 73 to be applied to the first load current collecting conductor track 71 already during the production of the printed circuit board 7.

Such a construction has the advantage that the first load current collecting conductor track 71 can be led through below the control signal conductor track or control signal conductor tracks 73, such that the region below the control signal conductor tracks 73 can also be utilized for conducting the current in the first load current collecting conductor track 71. In addition, the control signal conductor tracks 73 are shielded from capacitive coupling interference from the metallization layer 7*b* through the conductor track 71. Such coupling interference arises for example if the conductor track 71 in a half-bridge experiences a sudden voltage change and the metallization layer 7*b* is grounded. By contrast, in the first example according to FIGS. 1 to 3 and the fifth example in accordance with FIGS. 13 to 15 (for the explanation thereof see below), the control signal conductor tracks 73 in the same way as the first load current collecting conductor track 71 are parts of the upper metallization layer 7*t* and 8*t*, respectively, and are embodied as islands in the first load current collecting conductor track 71. As a result, the first load current collecting conductor track 71 has in the region of the control signal conductor tracks 73 in each case a locally reduced cross-sectional area (i.e., transversely with respect to the first lateral direction r1), which locally increases the electrical resistance and the leakage inductance of the first load current collecting conductor track 71.

In the third example (FIGS. 7 to 9), the first load current collecting conductor track 71 is arranged on the printed circuit board 7, here on that side of the second load current collecting conductor track 72 which faces away from the insulation carrier 70.

The control signal conductor tracks 73 are likewise arranged on the printed circuit board 7, here on that side of the first load current collecting conductor track 71 which faces away from the insulation carrier 70. In order to electrically insulate the control signal conductor tracks 73 from the first load current collecting conductor track 71, a dielectric layer 76 is arranged between them. Correspondingly, a dielectric layer 77 is arranged between the first load current collecting conductor track 71 and the second load current collecting conductor track 72 in order to electrically insulate these from one another.

The dielectric layers 76 and 77 can be, independently of one another and in arbitrary combinations with one another, for example a layer composed of or comprising ceramic, glass, plastic (e.g., an imide) or some other electrically insulating material. In this case, the dielectric layers 76 and 77 can consist of identical or different materials.

In order to produce this arrangement, the dielectric layer 77, the first load current collecting conductor track 71, the dielectric layer 76 and the control signal conductor track 73 can be applied to the printed circuit board 7 after the production of the printed circuit board 7 (having the insulation layer 70, the lower metallization layer 7*b* and the upper metallization layer 7*t*). It is likewise possible, however, to apply the dielectric layer 76 and the control signal conductor tracks 73 to the first load current collecting conductor track 71 already during the production of the printed circuit board 7.

Such a construction likewise has the advantage that the first load current collecting conductor track 71 can be led through below the control signal conductor track or, if appropriate, a plurality of control signal conductor tracks 73, such that the region below the control signal conductor tracks 73 can also be utilized for conducting the current in the first load current collecting conductor track 71. The leakage inductance between 71 and 72 is reduced and the conductor track 71 is shielded against capacitive coupling interference from the lower metallization layer 7b. In addition, the control signal conductor tracks 73 are shielded from capacitive coupling interference from the metallization layer 7b through the conductor track 71. In addition, a reduction of the inductance in the control line is obtained in the case of a conductor track 73 passing through in the direction r1.

In all variants of the invention in which—as explained with reference to the second and third examples (FIGS. 4 to 6 and 7 to 9, respectively)—even further conductor tracks 71 and/or 73 with dielectric layers 77 and/or 76 situated below them and insulating them are applied to a prefabricated printed circuit board 7, the further conductor track 71 with the dielectric layer 77 insulating it and/or the further conductor track(s) 73 with the dielectric layer(s) 77 insulating it/them can optionally be prefabricated as a laminated film composite and the adhesively bonded onto the printed circuit board 7. Such a film composite constitutes a printed circuit board that is flexible (prior to adhesive bonding). Likewise, the dielectric layers 76, 77 and further conductor tracks 71, 73 (if present) can also be successively adhesively bonded onto the printed circuit board 7.

In the fourth example (FIGS. 10 to 12), the circuit carrier 9 comprises a first printed circuit board 7, and also at least one second printed circuit board 8. The first printed circuit board 7 has a dielectric insulation carrier 70, which is provided with a structured upper metallization layer 7t on a top side, and also with a lower metallization layer 7b on an underside opposite to the top side. The first load current collecting conductor track 71, the second load current collecting conductor track 72 and the control signal conductor tracks 73 are embodied as sections of the upper metallization layer 7t that are spaced apart from one another.

Each second printed circuit board 8 has a dielectric insulation carrier 80, which is provided with a structured or unstructured upper metallization layer 8t on a top side, and also with a lower metallization layer 8b on an underside opposite to the top side. The upper metallization layer 8t and the lower metallization layer 8b are electrically insulated from one another by the insulation carrier 80 situated therebetween. The upper metallization layer 8t forms one of the control signal conductor tracks 73, or it comprises one or a plurality of the control signal conductor tracks 73. At its lower metallization layer 8b, the second printed circuit board 8 is cohesively connected to the first printed circuit board 7 by means of a planar connection layer 87. The connection layer 87 can be embodied e.g., as a solder layer, for example as a diffusion solder layer, as a layer comprising sintered metal powder (e.g., a silver powder), or an electrically insulating or electrically conductive adhesive. By way of example, the second printed circuit board 8 can be connected to the first load current collecting conductor track 71 at its lower metallization layer 8b. The connection layer 87 is then arranged between the lower metallization layer 8t and the first load current collecting conductor track 71.

Such a construction has the same advantage as the construction in accordance with the second example (FIGS. 4 to 6). A construction in accordance with the third example can be produced for example by a procedure in which firstly the first printed circuit board 7 (having the insulation carrier 70, the lower metallization layer 7b and the upper metallization layer 7t) and the second printed circuit board 8 (having the insulation carrier 80, the lower metallization layer 8b and the upper metallization layer 8t) are produced separately and are then connected to one another with the aid of a connection layer 87.

In the fifth example (FIGS. 13 to 15), the circuit carrier 9 likewise comprises a first printed circuit board 7 and also a second printed circuit board 8. The first printed circuit board 7 has a dielectric insulation carrier 70, which is provided with a structured or unstructured upper metallization layer 7t on a top side, and also with a lower metallization layer 7b on an underside opposite to the top side. The second load current collecting conductor track 72 is formed in the upper metallization layer 7t.

The second printed circuit board 8 has a dielectric insulation carrier 80, which is provided with a structured or unstructured upper metallization layer 8t on a top side, and also with a lower metallization layer 8b on an underside opposite to the top side. The upper metallization layer 8t and the lower metallization layer 8b are electrically insulated from one another by the insulation carrier 80 situated therebetween. The first load current collecting conductor track 71 and one, a plurality or all of the control signal conductor tracks 73 are formed in the upper metallization layer 8t.

At its lower metallization layer 8b, the second printed circuit board 8 is cohesively connected to the first printed circuit board 7 by means of a planar connection layer 87. The connection layer 87 can be embodied e.g., as a solder layer, for example as a diffusion solder layer, as a layer comprising sintered metal powder (e.g., a silver powder), or an electrically insulating or electrically conductive adhesive. By way of example, the second printed circuit board 8 can be connected to the second load current collecting conductor track 72 at its lower metallization layer 8b. The connection layer 87 is then arranged between the lower metallization layer 8b and the second load current collecting conductor track 72.

In the sixth example (FIGS. 16 to 18), the circuit carrier 9 likewise comprises a first printed circuit board 7 and also a second printed circuit board 8. The first printed circuit board 7 has a dielectric insulation carrier 70, which is provided with a structured or unstructured upper metallization layer 7t on a top side, and also with a lower metallization layer 7b on an underside opposite to the top side. The second load current collecting conductor track 72 is formed in the upper metallization layer 7t.

The second printed circuit board 8 has a dielectric insulation carrier 80, which is provided with a structured or unstructured upper metallization layer 8t on a top side, and also with a lower metallization layer 8b on an underside opposite to the top side. The upper metallization layer 8t and the lower metallization layer 8b are electrically insulated from one another by the insulation carrier 80 situated therebetween. The first load current collecting conductor track 71 is formed in the upper metallization layer 8t.

At its lower metallization layer 8b, the second printed circuit board 8 is cohesively connected to the first printed circuit board 7 by means of a planar connection layer 87. The connection layer 87 can be embodied e.g., as a solder layer, for example as a diffusion solder layer, as a layer comprising sintered metal powder (e.g., a silver powder), or an electrically insulating or electrically conductive adhesive. By way of example, the second printed circuit board 8 can be connected to the second load current collecting conductor track 72 at its lower metallization layer 8b. The connection layer 87 is then arranged between the lower metallization layer 8b and the second load current collecting conductor track 72.

In the same way as in the second example (FIGS. 4 to 6), the control signal conductor tracks 73 of the circuit carrier 9 are arranged on the first load current collecting conductor track 71, i.e., on that side of the first load current collecting conductor track 71 which faces away from the insulation carrier 70. In order to electrically insulate the control signal conductor tracks 73 from the first load current collecting conductor track 71, a dielectric layer 76 is in each case arranged between them. The dielectric layer 76 can be for example a layer composed of or comprising ceramic, glass, plastic (e.g., an imide) or some other electrically insulating material.

In order to produce this arrangement, the dielectric layer 76 and the control signal conductor tracks 73 can be applied to the prefabricated composite in which the printed circuit board 7 (having the insulation carrier 70, the lower metallization layer 7b and the upper metallization layer 7t) and the printed circuit board 8 (having the insulation carrier 80, the lower metallization layer 8b and the upper metallization layer 8t) are connected to one another by the connection layer 87. This can optionally be carried out before or after this composite is populated with the power semiconductor chips 1.

A construction in accordance with the sixth example has the advantage that the first load current collecting conductor track 71 can be led through below the control signal conductor track or control signal conductor tracks 73, such that the region below the control signal conductor tracks 73 can also be utilized for conducting the current in the first load current collecting conductor track 71. In addition, the control signal conductor tracks 73 are shielded from capacitive coupling interference from the metallization layer 7b through the conductor track 71. As already mentioned, such coupling interference can arise for example if the conductor track 71 in a half-bridge experiences a sudden voltage change and the metallization layer 7b is grounded. By contrast, in the first example according to FIGS. 1 to 3 and the fifth example in accordance with FIGS. 13 to 15, the control signal conductor tracks 73 in the same way as the first load current collecting conductor track 71 are parts of the upper metallization layer 7t and 8t, respectively, and are embodied as islands in the first load current collecting conductor track 71. As a result, the first load current collecting conductor track 71 has in the region of the control signal conductor tracks 73 in each case a locally reduced cross-sectional area (i.e., transversely with respect to the first lateral direction r1), which locally increases the electrical resistance and the leakage inductance of the first load current collecting conductor track 71.

In all embodiments of the invention, the first printed circuit board 7 and/or—if present—the second printed circuit board 8 can be in each case a ceramic substrate in which the relevant insulation carrier 70 and/or 80 is embodied as a ceramic layer or comprises ceramic. Metals having good electrical conductivity such as, for example, copper or copper alloys, aluminum or aluminum alloys are suitable as materials for the relevant upper metallization layer 7t and/or 8t, the relevant lower metallization layer 7b and/or 8b, the first load current collecting conductor track 71, the second load current collecting conductor track 72, and also the control signal conductor tracks 73 and all other conductor tracks of the circuit carrier 9.

The ceramic layer can be for example a layer composed of or comprising aluminum oxide ($Al_2O_3$), aluminum nitride (AlN) or zirconium oxide ($ZrO_2$). Printed circuit boards 7 and/or 8 embodied as a ceramic substrate can be e.g., DCB substrates (DCB=Direct Copper Bonding), DAB substrates (DAB=Direct Aluminum Bonding), AMB substrates (AMB=Active Metal Brazing) or IMS substrates (IMS=Insulated Metal Substrate). The upper and/or the lower metallization layers 7t and/or 8t and 7b and/or 8b of the same printed circuit board 7 and/or 8 can have, independently of one another, in each case a thickness in the range of 0.05 mm to 2.5 mm. The thickness of the first and/or second insulation carrier 70 and/or 80 can be e.g., in the range of 0.1 mm to 2 mm. However, thicknesses that are larger or smaller than those indicated are likewise possible.

Insofar as a first load current collecting conductor track 71 and/or a control signal conductor track 73 are applied to that side of the upper metallization layer 7t which faces away from the insulation carrier 70 by means of one or a plurality of connection layers 76, 77 (see e.g., the second example in accordance with FIGS. 4 to 6 or the third example in accordance with FIGS. 7 to 9 or the fourth example in accordance with FIGS. 10 to 12), the first load current collecting conductor track 71 and the control signal conductor track(s) 73 can be regarded as parts of the first printed circuit board 7 (having the upper metallization layer 7t, the insulation carrier 70 and the lower metallization layer 7b) or as elements which are applied to the first printed circuit board 7 (having the upper metallization layer 7t, the insulation carrier 70 and the lower metallization layer 7b), In this case, the first semiconductor chip or semiconductor chips 1 can be mounted on the upper metallization layer 7t before or after the first load current collecting conductor track 71 and/or the control signal conductor track(s) 73 are applied to that side of the upper metallization layer 7t which faces away from the insulation carrier 70 by means of one or a plurality of connection layers 76, 77.

Insofar as a first load current collecting conductor track 71 and/or a control signal conductor track 73 are applied to that side of the upper metallization layer 8t which faces away from the insulation carrier 80 by means of one or a plurality of connection layers 76, 77 (see e.g., the fourth example in accordance with FIGS. 10 to 12 or the sixth example in accordance with FIGS. 16 to 18), the first load current collecting conductor track 71 and the control signal conductor track(s) 73 can be regarded as parts of the second printed circuit board 8 (having the upper metallization layer 8t, the insulation carrier 80 and the lower metallization layer 8b) or as elements which are applied to the second printed circuit board 8 (having the upper metallization layer 8t, the insulation carrier 80 and the lower metallization layer 8b), In this case, the first semiconductor chip or semiconductor chips 1 can be mounted on the upper metallization layer 7t before or after the first load current collecting conductor track 71 and/or the control signal conductor track(s) 73 are applied to that side of the upper metallization layer 8t which faces away from the insulation carrier 80 by means of one or a plurality of connection layers 76, 77.

Insofar as a second printed circuit board 8 is present which is arranged on that side of the upper metallization layer 7t which faces away from the insulation carrier 70, and is connected to the first printed circuit board 7 by means of a connection layer 87 (see e.g., the fourth example in accordance with FIGS. 10 to 12, the fifth example in accordance with FIGS. 13 to 15 and the sixth example in accordance with FIGS. 16 to 18), the mounting of the second printed circuit board 8 on the first printed circuit board 7 by means of the connection layer 87 can be carried out at the same time as, before or after the mounting of the semiconductor chips 1 on the first printed circuit board 7. In the case of simultaneous mounting, it is advantageous if the connection layers 17 and the connection layers 87 are produced simultaneously and by means of the same technology (e.g., sintering, adhesive bonding or soldering, for example diffusion soldering).

Figure 19:
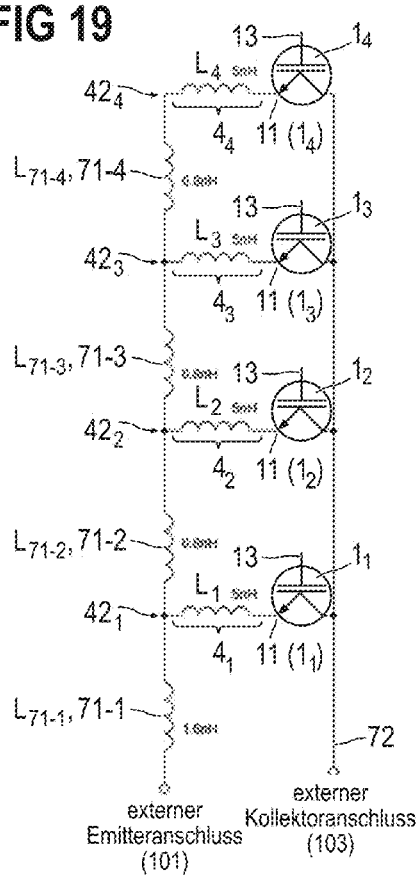

FIG. 19 shows an equivalent circuit diagram of the wiring of a parallel connection of a plurality of semiconductor chips

1 which are arranged in a series parallel to the first lateral direction r1. In this case, all electrical conductors (e.g., conductor tracks, bonding wires) by means of which the parallel connection is realized are regarded as "wiring". In order to differentiate among the (four here merely by way of example) semiconductor chips 1, the reference signs thereof are also provided with an index 1, 2, 3 or 4. Insofar as specific elements among those illustrated are assigned to exactly one of the semiconductor chips $\mathbf{1}_1$, $\mathbf{1}_2$, $\mathbf{1}_3$ or $\mathbf{1}_4$, the relevant reference signs are likewise provided with a corresponding index 1, 2, 3 or 4. In this regard, for example, the reference sign "$\mathbf{11}(\mathbf{1}_3)$" indicates the first load terminal 11 of the third (index 3) of the semiconductor chips 1. Correspondingly, "$\mathbf{4}_2$" refers to the or, in the case of a plurality, to all the connection conductors 4 with which the first load terminal 11 of the second (index 2) of the semiconductor chips 1 is connected to the first load current collecting conductor track 71, and $L_2$ indicates the total inductance of this, or, in the case of a plurality, these connection conductors $\mathbf{4}_2$. $L_{71\text{-}2}$ to $L_{71\text{-}4}$ is in each case the inductance of a section 71-2, 71-3 and 71-4 of the first load current collecting conductor track 71 that is situated between two directly adjacent second connection locations $\mathbf{42}_1$ and $\mathbf{42}_2$, $\mathbf{42}_2$ and $\mathbf{42}_3$ and respectively $\mathbf{42}_3$ and $\mathbf{42}_4$. One, a plurality or each of said inductances $L_{71\text{-}2}$ to $L_{71\text{-}4}$ can be chosen for example— in each case—to be less than 1 nH, wherein the second connection locations $\mathbf{42}_1$, $\mathbf{42}_2$, $\mathbf{42}_3$ and $\mathbf{42}_4$ of all of the parallel-connected semiconductor chips $\mathbf{1}_1$, $\mathbf{1}_2$, $\mathbf{1}_3$, $\mathbf{1}_4$ of the relevant series should be taken as a basis for the alternative "each". Such low inductances can be achieved, inter alia, by means of a small distance between the load current collecting conductor track 71 and the lower metallization layer 7b running parallel thereto, and also by means of large widths and a large overlap of the load current collecting conductor track 71 and lower metallization layer 7b, and by means of small distances between adjacent semiconductor chips 1 in the lateral direction r1.

The section 71-1 of the first load current collecting conductor track 71 leads from the second connection location $\mathbf{42}_1$ of the first semiconductor chip $\mathbf{1}_1$ of the series to an external terminal (here: an emitter terminal) and can therefore optionally have a greater inductance than each of the other sections 71-2, 71-3 and 71-4. In this sense, "first semiconductor chip $\mathbf{1}_1$ of the series" is considered to be that one ($\mathbf{1}_1$) of the semiconductor chips $\mathbf{1}_1$, $\mathbf{1}_2$, $\mathbf{1}_3$ or $\mathbf{1}_4$ whose second connection location $\mathbf{42}_1$ is that one of the second connection locations $\mathbf{42}_1$, $\mathbf{42}_2$, $\mathbf{42}_3$, $\mathbf{42}_4$ which is closest to an external terminal of the circuit arrangement (here: an external emitter terminal) in terms of circuitry. The ohmic resistance between the external terminal and the second connection location $\mathbf{42}_1$ of the first semiconductor chip $\mathbf{1}_1$ is therefore lower than each of the ohmic resistances between the external terminal and one of the second connection locations $\mathbf{42}_2$, $\mathbf{42}_3$ and $\mathbf{42}_4$ of the other semiconductor chips $\mathbf{1}_2$, $\mathbf{1}_3$, $\mathbf{1}_4$ of the series.

The arrangement can additionally be embodied such that for one, more than one or (with the exception of the first semiconductor chip 1, of the series) all of the semiconductor chips $\mathbf{1}_2$, $\mathbf{1}_3$ and $\mathbf{1}_4$ of the series in each case the criterion holds true that the product of the rated current $I_{rated}$ of the relevant semiconductor chip $\mathbf{1}_2$, $\mathbf{1}_3$ and/or $\mathbf{1}_4$ and the inductance $L_{71\text{-}2}$) $L_{71\text{-}3}$ and/or $L_{71\text{-}4}$ of that section of the first load current collecting conductor track 71 which leads from the second connection location $\mathbf{42}_2$, $\mathbf{42}_3$ and/or $\mathbf{42}_4$ of the relevant semiconductor chip $\mathbf{1}_2$, $\mathbf{1}_3$ and/or $\mathbf{1}_4$ in the direction of the second connection location $\mathbf{42}_1$ of the first semiconductor chip $\mathbf{1}_1$ and extends as far as that one of the second connection locations $\mathbf{42}_1$, $\mathbf{42}_2$ and/or $\mathbf{42}_3$ which is closest thereto is less than 15 nVs. To put it another way, that means that for all j≥2 it holds true that $L_{71\text{-}j} \cdot I_{rated}(\mathbf{1}_j)$ is less than 15 nVs. $I_{rated}$ can be in each case less than or equal to 15 A for example for one, a plurality or each of the semiconductor chips of the series or—in the case of a plurality of series— for one, a plurality or each of the parallel-connected semiconductor chips. In accordance with a further option, the sum of the rated currents $I_{rated}$ of all the parallel-connected semiconductor chips can be less than or equal to 150 A.

In the example shown the total inductances $L_1$, $L_2$, $L_3$ and $L_4$ are 5 nH in each case. By way of example, each of the total inductances $L_1$, $L_2$, $L_3$ and $L_4$ can be greater than or equal to 2 nH and less than or equal to 10 nH. For j≥2, the inductances $L_j$ are in each case greater than the inductances $L_{71\text{-}j}$. This results in a more uniform current division among the different semiconductor chips $\mathbf{1}_1$, $\mathbf{1}_2$, $\mathbf{1}_3$, $\mathbf{1}_4$. The inductances $L_{71\text{-}j}$ where j≥2 result in an incorrect current division in particular during switching because as a result from semiconductor chip $\mathbf{1}_1$, $\mathbf{1}_2$, $\mathbf{1}_3$ to semiconductor chip $\mathbf{1}_2$, $\mathbf{1}_3$, $\mathbf{1}_4$ an inductive voltage drop arises which leads to different electrical potentials at the first load terminals 11 of the different semiconductor chips $\mathbf{1}_1$, $\mathbf{1}_2$, $\mathbf{1}_3$, $\mathbf{1}_4$ and to different control voltages at the semiconductor chips $\mathbf{1}_1$, $\mathbf{1}_2$, $\mathbf{1}_3$, $\mathbf{1}_4$. The control voltage of a semiconductor chip $\mathbf{1}_1$, $\mathbf{1}_2$, $\mathbf{1}_3$, $\mathbf{1}_4$ here is in each case the difference between the electrical potential of the control terminal 13 and the electrical potential of the first load terminal 11 of the relevant semiconductor chip $\mathbf{1}_1$, $\mathbf{1}_2$, $\mathbf{1}_3$, $\mathbf{1}_4$. On account of the control or transfer characteristic of the semiconductor chips $\mathbf{1}_1$, $\mathbf{1}_2$, $\mathbf{1}_3$, $\mathbf{1}_4$, the different control voltages (e.g., during switching processes) lead to different currents through the load paths of the semiconductor chips $\mathbf{1}_1$, $\mathbf{1}_2$, $\mathbf{1}_3$, $\mathbf{1}_4$. If for j≥2 the inductances $L_j$ are chosen to be large relative to $L_{71\text{-}j}$, then the $L_j$ in the different semiconductor chips $\mathbf{1}_1$, $\mathbf{1}_2$, $\mathbf{1}_3$, $\mathbf{1}_4$ bring about approximately identical rates of change ($dI_j/dt$) of the load currents $dI_j$ (i.e., the derivative thereof with respect to time t) through the load paths of the different semiconductor chips $\mathbf{1}_1$, $\mathbf{1}_2$, $\mathbf{1}_3$, $\mathbf{1}_4$ and thus a very homogeneous distribution of the load current of the parallel-connected semiconductor chips 1 among the individual semiconductor chips 1. In practice, the ratios of $L_j$ to $L_{71\text{-}j}$ cannot be chosen arbitrarily. However, it can always hold true that $L_j$ for all j≥2 is greater than twice $L_{71\text{-}j}$. To put it another way, for j≥2 it holds true that $L_j > 2 \cdot L_{71\text{-}j}$. In order to increase the explained effect further, $L_j$ for all j≥2 can also be chosen to be greater than five times $L_{71\text{-}j}$. By way of example, for $L_j$ for j≥2 it is readily possible to achieve values of up to ten times $L_{71\text{-}j}$.

In accordance with a further option, it can hold true that for each of the semiconductor chips $\mathbf{1}_1$, $\mathbf{1}_2$, $\mathbf{1}_3$, $\mathbf{1}_4$ of the relevant series, the total inductance $L_j$ (j≥1) of all the connection conductors 4 with which the first load terminal 11 of the relevant semiconductor chip $\mathbf{1}_1$, $\mathbf{1}_2$, $\mathbf{1}_3$, $\mathbf{1}_4$ is connected to the first load current collecting conductor track 71 is greater than each of the inductances $L_{71\text{-}j}$ (j≥2) of a section 71-2, 71-3 and 71-4 of the first load current collecting conductor track 71 that is situated between two directly adjacent second connection locations $\mathbf{42}_1$ and $\mathbf{42}_2$, $\mathbf{42}_2$ and $\mathbf{42}_3$ and respectively $\mathbf{42}_3$ and $\mathbf{42}_4$, wherein here the second connection locations $\mathbf{42}_1$, $\mathbf{42}_2$, $\mathbf{42}_3$ and $\mathbf{42}_4$ of all the parallel-connected semiconductor chips $\mathbf{1}_1$, $\mathbf{1}_2$, $\mathbf{1}_3$, $\mathbf{1}_4$ of the relevant series should be taken as a basis.

In accordance with yet another option, the sum of the inductances $L_{71\text{-}j}$ (j≥2) of all sections 71-2, 71-3 and 71-4 of the first load current collecting conductor track 71 that are situated between two directly adjacent second connection locations $\mathbf{42}_1$ and $\mathbf{42}_2$, $\mathbf{42}_2$ and $\mathbf{42}_3$, and respectively $\mathbf{42}_3$ and $42_4$ can be less than or equal to 5 nH, wherein here, too, the second connection locations $42_1$, $42_2$, $42_3$ and $42_4$ of all the parallel-connected semiconductor chips $1_1$, $1_2$, $1_3$, $1_4$ of the relevant series should be taken as a basis. What can be achieved as a result of this measure is that the load currents of the individual semiconductor chips $1_1$, $1_2$, $1_3$, $1_4$ of the relevant series do not differ all that much.

Optionally, the total inductances L1, L2, L3 and L4 of all the parallel-connected semiconductor chips $1_1$, $1_2$, $1_3$, $1_4$ of the relevant series can be chosen to be identical. It is likewise possible, however, for the total inductances L1, L2, L3 and L4 of all the semiconductor chips $1_1$, $1_2$, $1_3$, $1_4$ of the relevant series to decrease monotonically or strictly monotonically with increasing circuitry distance between the associated second connection locations $42_1$, $42_2$, $42_3$ and $42_4$ and an external terminal (in the example in accordance with FIG. 19; the external emitter terminal) of the first load current collecting conductor track 71. To put it another way, that means that the following holds true in the case of "monotonically": L1≥L2≥L3≥L4, and in the case of "strictly monotonically": L1>L2>L3>L4. It generally holds true that the inductance of a first section (e.g., 71-2) of the first load current collecting conductor track 71 in the case of "monotonically" is greater than or equal to, or in the case of "strictly monotonically" is greater than, the inductance of a second section (e.g., 71-3) of the first load current collecting conductor track 71 that is adjacent to the first section. Each of these criteria ("identical", "monotonically", "strictly monotonically") can hold true for two, more than two or all pairs of successive sections 71-2, 71-3, 71-4 of the first load current collecting conductor track 71 which are formed between in each case two circuitry-adjacent second connection locations $42_1$ and $42_2$, $42_2$ and $42_3$, $42_3$ and $42_4$ at which the first load terminals 11 of the parallel-connected semiconductor chips $1_1$, $1_2$, $1_3$, $1_4$ of the relevant series (e.g., 31) are connected to the first load current collecting conductor track 71.

Figure 29:
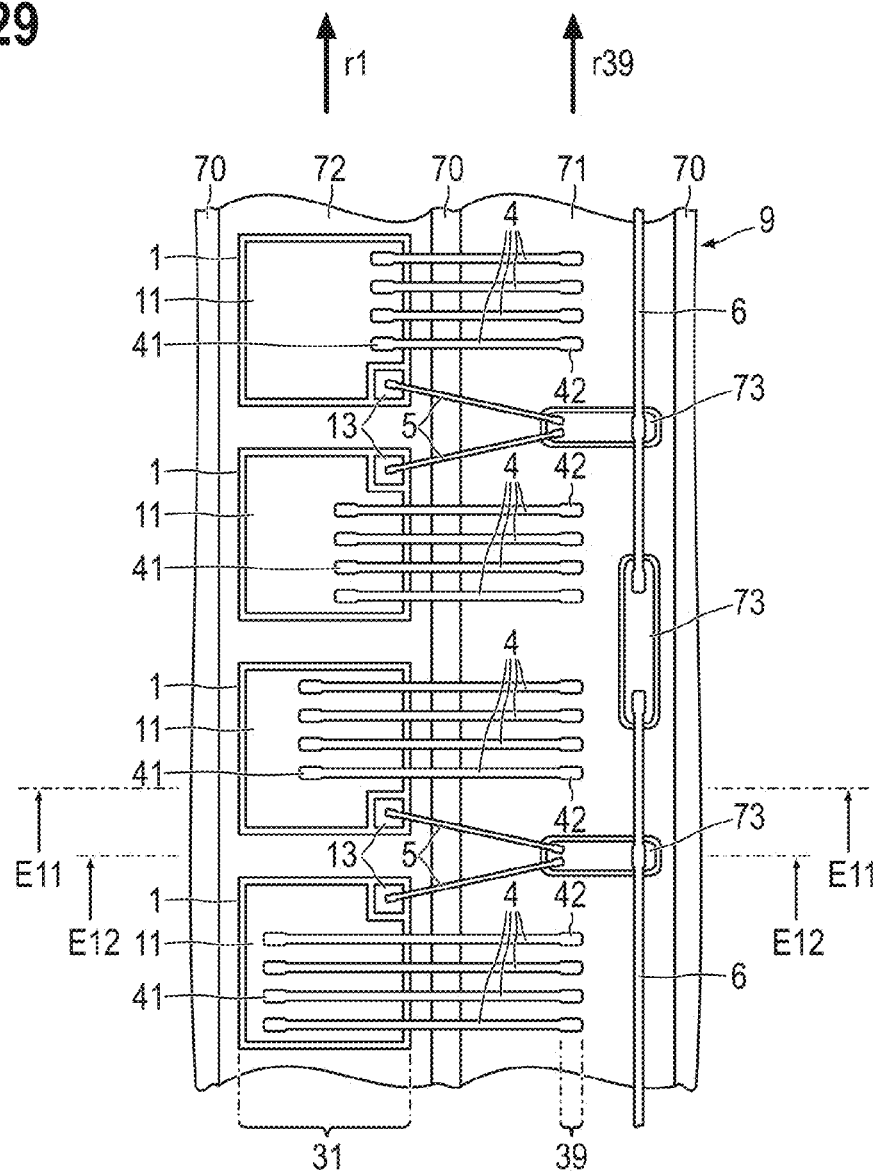
Figure 30:
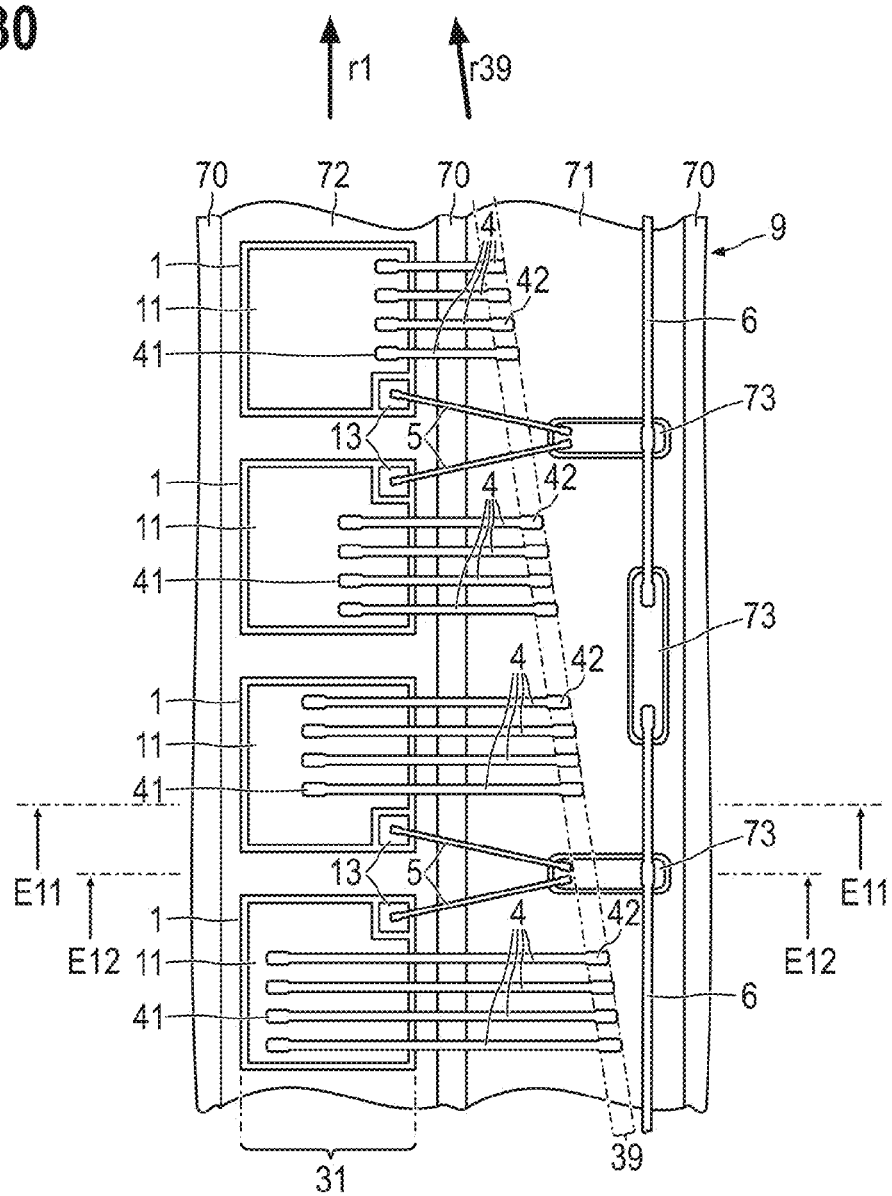

Examples of how the criteria mentioned can be realized are shown in FIGS. 29 and 30 merely by way of example on the basis of a construction in accordance with the first example (FIGS. 1 to 3). In both cases, for each of the semiconductor chips $1_1$, $1_2$, $1_3$, $1_4$ of the series, the total inductance of all the connection conductors 4 with which the first load terminal 11 of the relevant semiconductor chip $1_1$, $1_2$, $1_3$, $1_4$ is connected to the first load current collecting conductor track 71 is set by means of different lengths of the connection conductors 4.

Figure 20:
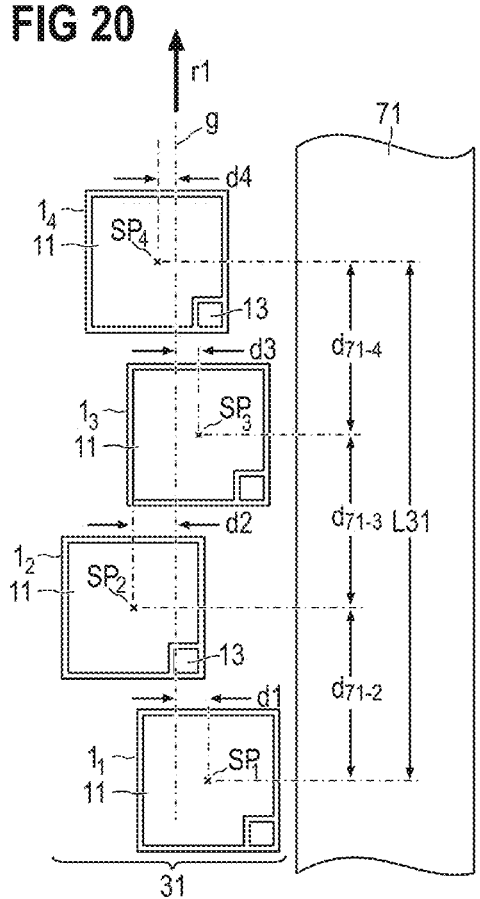

In the case of the present invention, specific elements such as, for example, semiconductor chips 1 or second connection locations 42 are arranged in each case in a series 31 and respectively 39 (see FIGS. 1, 4, 7, 10, 13, 16). With reference to FIG. 20, on the basis of the example of four semiconductor chips $1_1$, $1_2$, $1_3$ and $1_4$ arranged in a series 31, an explanation is now given of when two or more elements (e.g., semiconductor chips 1 or second connection locations 42) are arranged in a series within the meaning of the present invention.

As is shown in FIG. 2, for example, the insulation carrier 70E can have a planar top side which faces the semiconductor chips 1 and which lies in a plane E0. Each of the elements (these are the semiconductor chips $1_1$, $1_2$, $1_3$ and $1_4$) merely by way of example in FIG. 20) has in this place E0 a projection area which arises as a result of the relevant element being projected onto the plane E0 by means of an orthogonal projection. The projection areas in each case have an area centroid $SP_1$, $SP_2$, $SP_3$, $SP_4$ assigned to the relevant element $1_1$, $1_2$, $1_3$ and $1_4$, respectively. The elements $1_1$, $1_2$, $1_3$ and $1_4$ are arranged in a series within the meaning of the present invention if a straight line g exists for which it holds true that the ratio between the products of the average distance <d> between the area centroids $SP_1$, $SP_2$, $SP_3$, $SP_4$ and said straight line g and the number N of the semiconductor chips 1 in this series reduced by 1 and the largest distance L31 occurring between all the area centroids $SP_1$, $SP_2$, $SP_3$, $SP_4$ in the direction of the straight line g is less than or equal to a predefined factor f. The factor f can be chosen for example to be equal to 1 or even equal to 0.5. To put it another way, that means:

i.

$$\frac{\left(\frac{1}{N} \cdot \sum_{j=1}^{N} d_j\right) \cdot (N-1)}{L31} \leq f \quad (1)$$

In this case, N is the number of the semiconductor chips that are electrically connected in parallel and arranged in the relevant series. The first expression between parentheses in the numerator of the term on the side to the left of the inequality sign represents the average distance <d>. The average distance <d> is therefore given by the arithmetic mean of the individual distances d1, d2, d3, d4.

If the elements arranged in a series are connection locations such as, for example, the second connection locations 42, a connection location is understood to mean the interface between the parts connected to one another (in the example the interface between a connection conductor 4 and the first load current collecting conductor track 71). The first lateral direction r1 then runs parallel to the straight line g.

In order to determine the inductances $L_{71-2}$ to $L_{71-4}$ explained with reference to FIG. 19, it is necessary to determine the position of the second connection locations $42_2$, $42_3$ and $42_4$ since the inductance $L_{71-2}$ is given by the inductance of the section 71-2 of the first load current collecting conductor track 71 that is situated between the second connection locations $42_1$ and $42_2$, the inductance $L_{71-3}$ is given by the inductance of the section 71-3 of the first load current collecting conductor track 71 that is situated between the second connection locations $42_2$ and $42_3$, and the inductance $L_{71-4}$ is given by the inductance of the section 71-4 of the first load current collecting conductor track 71 that is situated between the second connection locations $42_3$ and $42_4$. For the case where a semiconductor chip $1_1$, $1_2$, $1_3$, $1_4$ is connected to the first load current collecting conductor track 71 only by exactly one connection conductor 4, the associated second connection location $42_1$, $42_2$, $42_3$ and $42_4$, respectively, is given by the area centroid of the interface between this connection conductor 4 and the first load current collecting conductor track 71. If a semiconductor chip $1_1$, $1_2$, $1_3$, $1_4$ is otherwise connected to the first load current collecting conductor track 71 by two or more connection conductors 4 (for example by four connection conductors in FIG. 1), the associated second connection location $42_1$, $42_2$, $42_3$ and $42_4$, respectively, is given by the area centroid of all the interfaces (in general interfaces spaced apart from one another) between the second connection locations 42 of all these connection conductors 4 of the relevant semiconductor chip and the first load current collecting conductor track 71.

Figure 21:
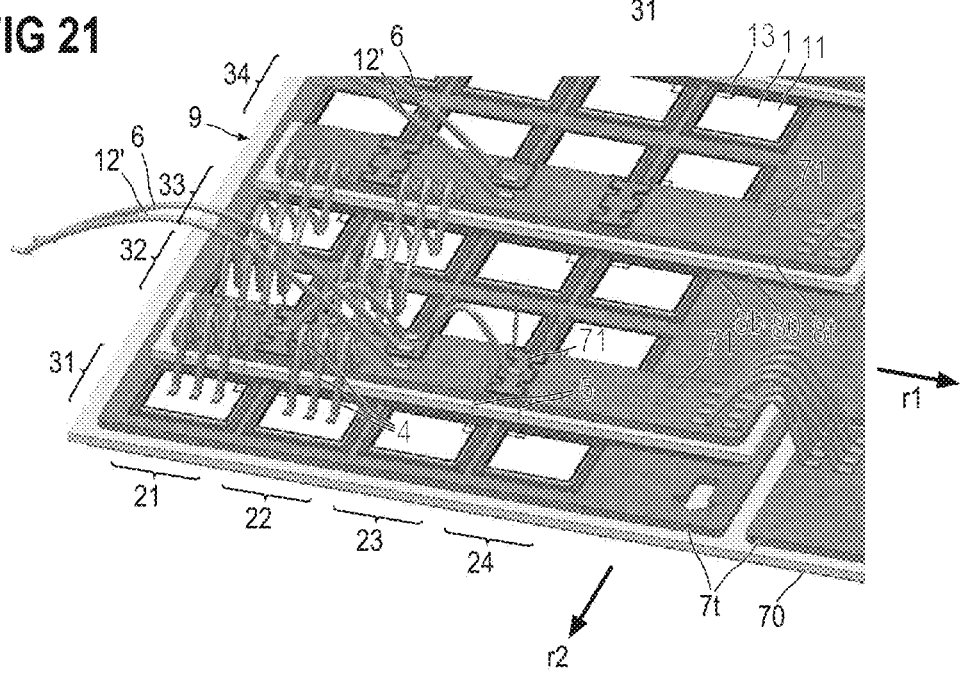

FIG. 21 shows a perspective view of a section of a circuit carrier of a semiconductor module. A plurality of series 31, 32, 33, 34 etc. are provided, each running in a first lateral direction r1. In each case one first load current collecting conductor track 71 runs between in each case two adjacent series 31 and 32, and 33 and 34, among the latter. The first load terminals 11 of those semiconductor chips 1 which are situated in the relevant adjacent series 31 and 32 or 33 and 34 are connected to each of the first load current collecting conductor tracks 71 via connection conductors 4. Each of the first load current collecting conductor tracks 71 therefore collects the load currents of the semiconductor chips 1 which are situated in the series 31 and 32 or 33 and 34 that are directly adjacent on both sides of the load current collecting conductor tracks 71.

Figure 13:
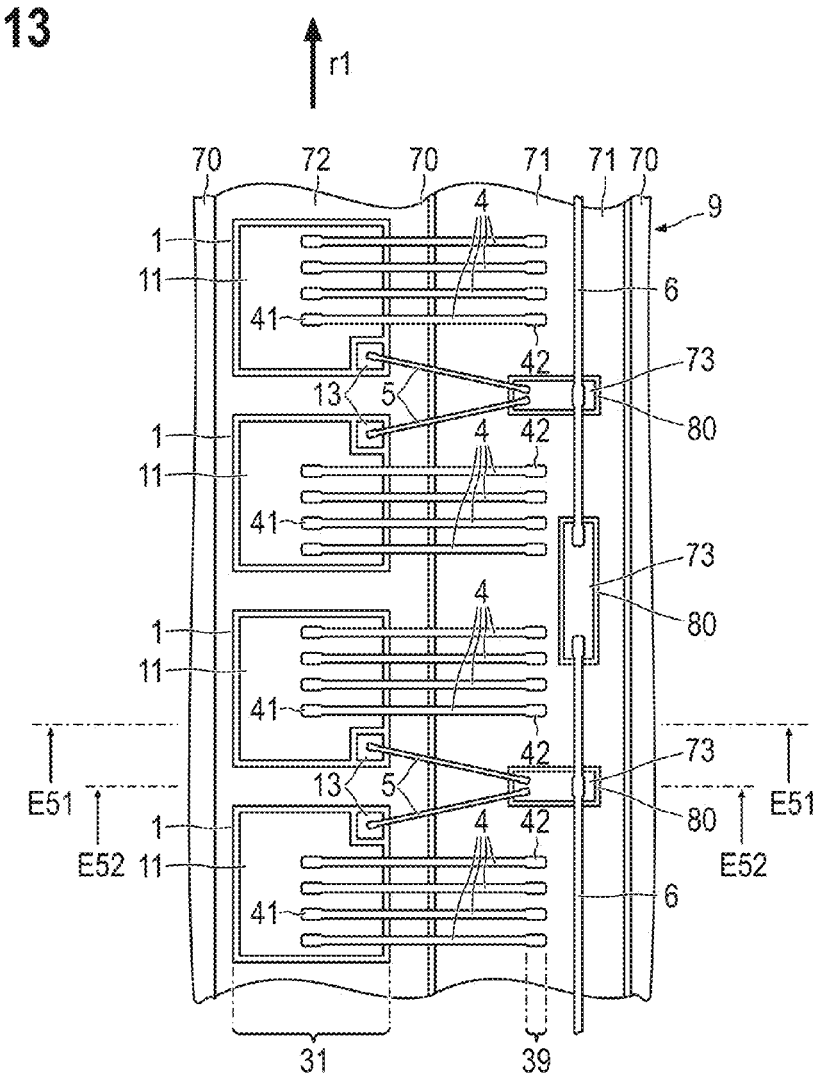
Figure 14:
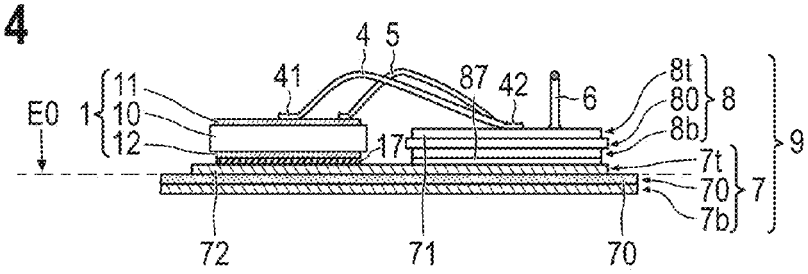
Figure 15:
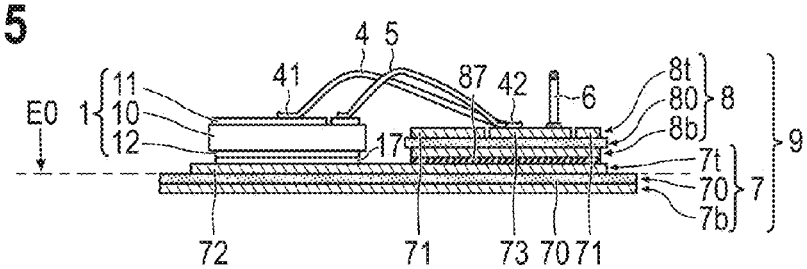

The principle shown can be realized in any desired manner, in particular in accordance with each of the embodiments explained with reference to FIGS. 1 to 18. The embodiment in accordance with FIGS. 13 to 15 is shown merely by way of example in FIG. 21.

As is likewise evident from FIG. 21, the semiconductor chips 1 of two, more than two or all of the series 31, 32, 33, 34 etc. of semiconductor chips 1 can be electrically connected in parallel by virtue of their first load terminals 11 being electrically conductively connected to one another and by virtue of their second load terminals 12 (hidden in FIG. 21) being electrically conductively connected to one another. In the case of the arrangement in accordance with FIG. 21, this is realized by means of bonding wires running in a second lateral direction r2. As is likewise evident from FIG. 21, the semiconductor chips 1 of the different series 31, 32, 33, 34 etc. can be arranged in lines 21, 22, 23, 24 etc. running in a second lateral direction r2 perpendicular to the first lateral direction r1.

Figure 22:
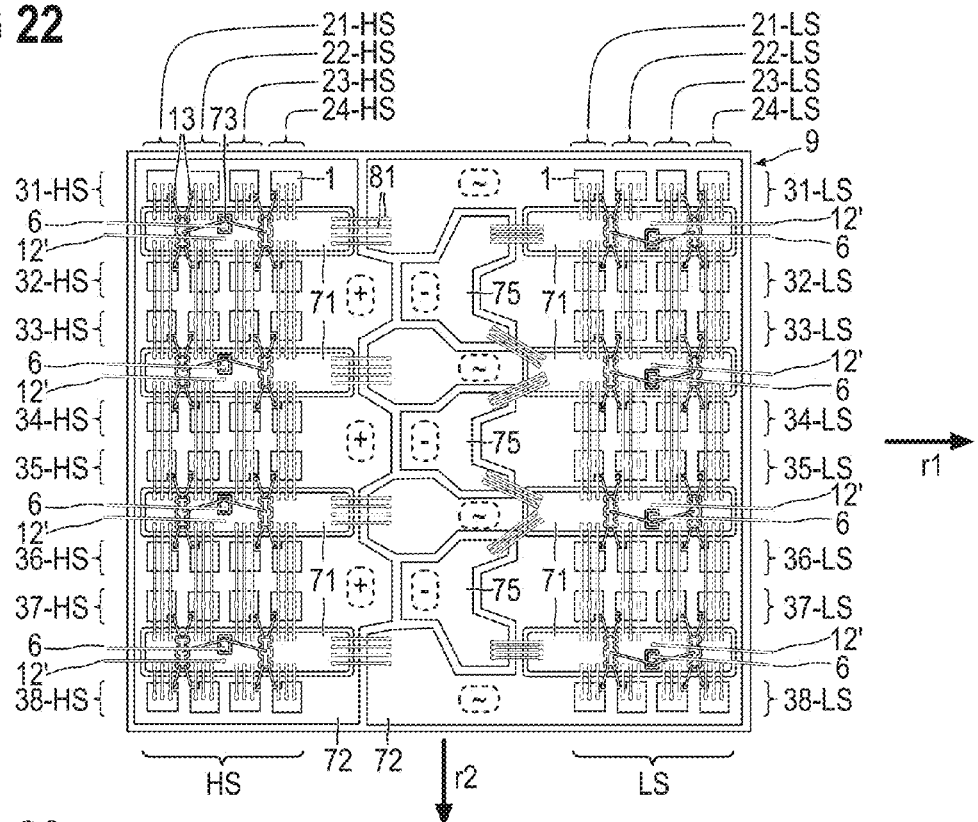
Figure 23:
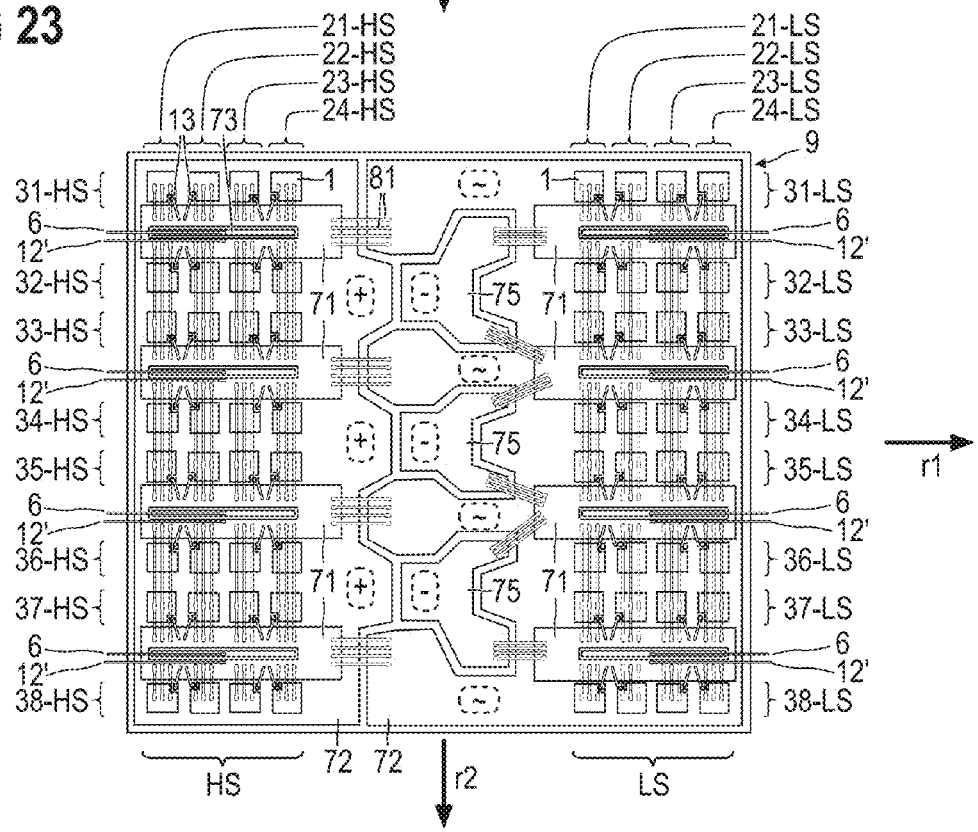

FIGS. 22 and 23 in each case show a plan view of a half-bridge in which the load paths of a logical low-side switch LS and of a logical high-side switch HS are electrically connected in series.

The logical low-side switch LS contains, for example, 4×8=32 semiconductor chips 1. In each of eight series 31-LS, 32-LS, 33-LS, 34-LS, 35-LS, 36-LS, 37-LS and 38-LS, in each case four of the semiconductor chips 1 are arranged one behind another. Moreover, the semiconductor chips 1 of the logical low-side switch LS are arranged in four lines 21-LS, 22-LS, 23-LS and 24-LS each having eight semiconductor chips 1. The first load terminals 11 of the semiconductor chips 1 of the logical low-side switch LS are electrically conductively connected to one another. The second load terminals 12 (hidden) of the semiconductor chips 1 of the logical low-side switch LS are likewise electrically conductively connected to one another. Moreover, the control terminals 13 of the semiconductor chips 1 of the logical low-side switch LS are electrically conductively connected to one another.

The logical high-side switch HS can optionally contain the same number of parallel-connected semiconductor chips 1 as the logical low-side switch LS, here as 4×8=32 semiconductor chips 1. In each of eight series 31-HS, 32-HS, 33-HS, 34-HS, 35-HS, 36-HS, 37-HS and 38-HS, in each case four of the semiconductor chips 1 are arranged one behind another. Moreover, the semiconductor chips 1 of the logical high-side switch HS are arranged in four lines 21-HS, 22-HS, 23-HS and 24-HS each having eight semiconductor chips 1. The first load terminals 11 of the semiconductor chips 1 of the logical high-side switch HS are electrically conductively connected to one another. The second load terminals 12 (hidden) of the semiconductor chips 1 of the logical high-side switch HS are likewise electrically conductively connected to one another. Moreover, the control terminals 13 of the semiconductor chips 1 of the logical high-side switch HS are electrically conductively connected to one another.

Both the series 31-LS, 32-LS, 33-LS, 34-LS, 35-LS, 36-LS, 37-LS and 38-LS of the logical low-side switch LS and the series 31-HS, 32-HS, 33-HS, 34-HS, 35-HS, 36-HS, 37-HS and 38-HS of the logical high-side switch HS run in the first lateral direction r1. Optionally, both the lines 21-LS, 22-LS, 23-LS and 24-LS of the logical low-side switch LS and the lines 21-HS, 22-HS, 23-HS and 24-HS of the logical high-side switch HS also run in a second lateral direction r2 perpendicular to the first lateral direction r1.

In order that the load paths of the logical low-side switch LS and of the logical high-side switch HS are electrically connected in series, each first load current collecting conductor track 71 of the logical high-side switch HS is electrically conductively connected to each second load current collecting conductor track 72 of the logical low-side switch LS. In the example shown, bonding wires 81 are used for this purpose, each of which is wire-bonded to a first load current collecting conductor track 71 of the logical high-side switch HS and to a second load current collecting conductor track 72 of the logical low-side switch LS. However, any other electrical connection techniques can also be used instead of or in addition to bonding wires 81.

The circuit carrier 9 furthermore has conductor tracks 75, which can be formed for example in the upper metallization layer 7t (the latter is shown for example in FIGS. 2, 3, 5, 6, 8, 9, 11, 12, 14, 15, 17 and 18) of the circuit carrier 7. In order to be able to electrically contact the circuit carrier 9 with the half-bridge situated thereon, the second load current collecting conductor track 72 of the logical low-side switch LS, the second load current collecting conductor track 72 of the logical high-side switch HS and also the conductor tracks 75 in each case have at least one terminal location which is illustrated by dashed lines closed in a ring-shaped fashion and at which a current terminal, for example a terminal plate, can be connected to the relevant conductor track 72, 75. Within the latter, dashed lines closed in a ring-shaped fashion are identified in each case by one of the symbols "+", "−" or "~". A terminal location marked with the symbol "+" in this case serves for connecting a positive supply voltage of the half-bridge, a terminal location marked with the symbol "−" serves for connecting a negative supply voltage of the half-bridge, and a terminal location marked with the symbol "~" serves for connecting an electrical load.

The semiconductor chips 1 both of the logical low-side switch LS and of the logical high-side switch HS contain in each case one controllable semiconductor component, for example in each case one IGBT or in each case one MOSFET or in each case one JFET or in each case one thyristor. Therefore, the semiconductor chips 1 both of the logical low-side switch LS and of the logical high-side switch HS in each case have a control terminal 13.

The control terminals 13 of the logical low-side switch LS are electrically conductively connected to one another in order that the semiconductor components of the semiconductor chips 1 of the logical low-side switch LS can be switched on and off simultaneously and synchronously. In order to produce the relevant electrically conductive connections, the control terminals 13 between the semiconductor chips 1 of in each case two adjacent series 31-LS and 32-LS, 33-LS and 34-LS, 35-LS and 36-LS, 37-LS and 38-LS are electrically conductively brought together at one (of possibly a plurality of) control signal conductor track(s) 73 to which a bonding wire 6 is connected in each case. The various bonding wires 6 of the logical low-side switch LS can be electrically conductively connected to one another and be connected to a common gate driver or to different, then synchronized gate drivers.

For each of the bonding wires 6, furthermore, another bonding wire 12' can be connected to that one of the first load current collecting conductor tracks 71 which runs between those series 31-LS and 32-LS, 33-LS and 34-LS, 35-LS and 36-LS, 37-LS and 38-LS of the semiconductor chips 1 to which the relevant bonding wire 6 is connected. The bonding wire 12' then serves in each case for connecting an electrical reference potential (e.g., auxiliary emitter, auxiliary source), for the driving of the control terminals 13 connected to the associated bonding wire 6.

Correspondingly, the control terminals 13 of the logical high-side switch HS are electrically conductively connected to one another in order that the semiconductor components of the semiconductor chips 1 of the logical high-side switch HS can be switched off and on simultaneously and synchronously. In order to produce the relevant electrically conductive connections, the control terminals 13 between the semiconductor chips 1 of in each case two adjacent series 31-HS and 32-HS, 33-HS and 34-HS, 35-HS and 36-HS, 37-HS and 38-HS are electrically conductively brought together at one (of possibly a plurality of) control signal conductor track(s) 73 to which a bonding wire 6 is connected in each case. The various bonding wires 6 of the logical high-side switch HS can be electrically conductively connected to one another and be connected to a common gate driver or to different, then synchronized gate drivers.

For each of the bonding wires 6, furthermore, another bonding wire 12' can be connected to that one of the first load current collecting conductor tracks 71 which runs between those series 31-HS and 32-HS, 33-HS and 34-HS, 35-HS and 36-HS, 37-HS and 38-HS of the semiconductor chips 1 to which the relevant bonding wire 6 is connected. The bonding wire 12' then serves in each case for connecting an electrical reference potential (e.g., an auxiliary emitter potential, if the first load terminals 11 are emitter chip metalizations, or an auxiliary source potential, if the first load terminals 11 are source chip metalizations) for the driving of the control terminals 13 electrically connected to the associated bonding wire 6.

Both in the case of the logical low-side switch LS and in the case of the logical high-side switch HS, the terminal location of each of the bonding wires 6 on the relevant control signal conductor track 73 can be chosen such that the electrical resistances between this terminal location and each of the control terminals 13 connected to the relevant bonding wire 6 are substantially identical. In this case, the position of the terminal location can be situated for example approximately in the center between the relevant control terminals 13. The arrangements in FIGS. 22 and 23 show different bonding wire and conductor track routings that make it possible to achieve such substantially identical electrical control terminal resistances.

FIGS. 24, 25 and 26 in each case show a plan view of sections of different printed circuit boards 9 which in each case have a parallel connection of a plurality of semiconductor chips 1 which are arranged in two adjacent parallel series 31, 32 extending in the first lateral direction r1. In the case of FIGS. 24 and 25, the bonding location of the bonding wire 6 on a control signal conductor track 73—in the first lateral direction r1—is situated in each case approximately in the center of the semiconductor chips 1 to whose control terminals 13 the bonding wire 6 is connected. In the case of the arrangement in accordance with FIG. 26, two control signal conductor tracks 73 are present, to which the control electrodes 13 of the four surrounding semiconductor chips 1 (two in series 31 and, opposite them, two in series 32) are directly connected by means of a bonding wire 5 in each case. The bonding wire 6 has in each case at least one bonding location on each of the control signal conductor tracks 73.

In the case of the example in accordance with FIG. 24, the further interconnection of the first load current collecting conductor track 71 is carried out with the aid of bonding wires 82 that are bonded to the end of the first load current collecting conductor track 71. In contrast thereto, in the case of the example in accordance with FIG. 25, the bonding locations at which the bonding wires 82 are bonded to the first load current collecting conductor track 71—in the first lateral direction r1—are situated in each case approximately in the center of the semiconductor chips 1 whose first load terminals 11 are directly connected to the first load current collecting conductor track 71 by means of the connection conductors 4. In the case of the example in accordance with FIG. 26, the first load current collecting conductor track 71 is simply continued. The second load current collecting conductor track 72 runs around the first load current collecting conductor track 71 in a U-shaped fashion.

The construction of the printed circuit boards 9 of the arrangements in accordance with FIGS. 24, 25, 26 can be implemented in each case according to one of or a modification of the principles explained with reference to FIGS. 1 to 18. The circuit carrier 9 comprises a printed circuit board 7, the insulation carrier 70 of which, as explained, can be a ceramic layer, for example, which is provided with a lower metallization layer 7b (the latter is hidden in FIGS. 24 to 26) and an upper metallization layer 7t, see FIGS. 2, 3, 5, 6, 8, 9, 11, 12, 14, 15, 17 and 18. Alternatively, the insulation carrier 70 can also be embodied as a non-ceramic dielectric layer.

The first load current collecting conductor track 71 can be formed in the upper metallization layer 7t (FIGS. 1 to 6) or can be formed by the latter, or it can be arranged on the upper metallization layer 7t and can be electrically insulated from the upper metallization layer 7t by means of a dielectric layer 77 or 80 (FIGS. 7 to 9, or 13 to 15, or 16 to 18). The control signal conductor tracks 73 that are electrically connected to the control electrodes 13 (insofar as such are present) by means of the bonding wires 5 can be formed either in the upper metallization layer 7t or in the same metallization layer as the first load current collecting conductor track 71 arranged on the printed circuit board 7 (FIGS. 13 to 15), or on the metallization layer in which the first load current collecting conductor track 71 is formed and can be insulated from said metallization layer by means of a dielectric layer 76, 80 (FIGS. 4 to 12 or 16 to 18).

Figure 27:
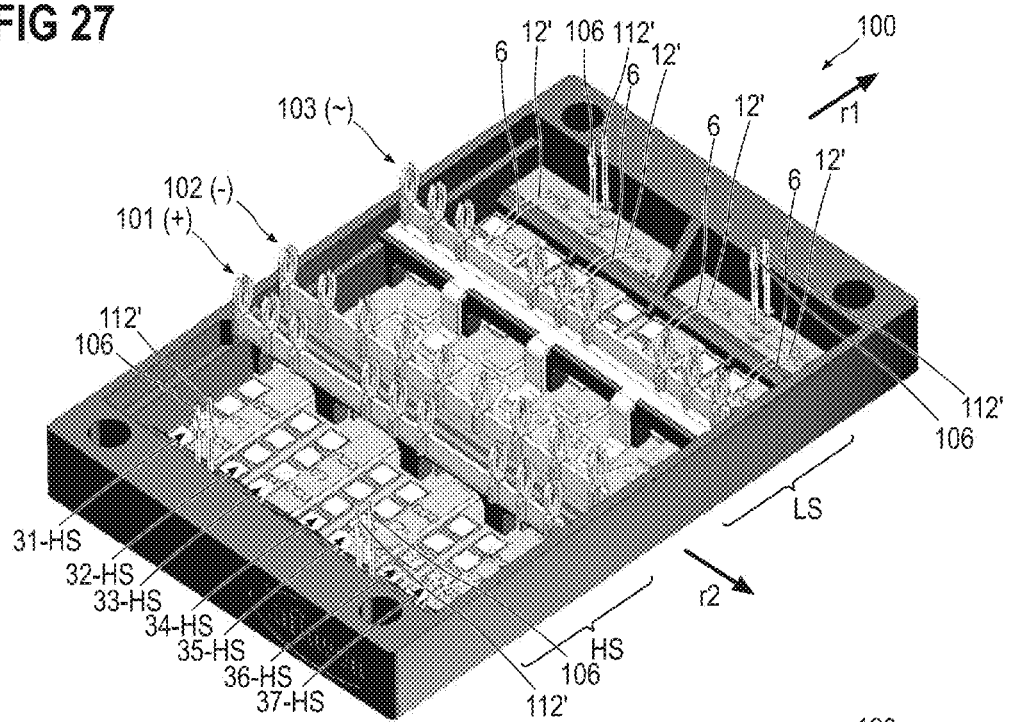

FIG. 27 shows another perspective view of an opened power semiconductor module 100. The power semiconductor module 100 contains a half-bridge having a logical low-side switch LS and a logical high-side switch HS, as explained for example with reference to FIGS. 22 and 23. A plurality of first external terminals 101, which are electrically conductively connected to one another in the interior of the semiconductor module 100 and serve for connecting a positive DC supply voltage, are arranged one behind another in a line extending in the second lateral direction r2 running perpendicular to the first lateral direction r1. As explained with reference to FIGS. 22 and 23, the logical high-side switch HS contains at least one series 31-HS, 32-HS, 33-HS, 34-HS, 35-HS, 36-HS, 37-HS and (hidden by the housing side wall in FIG. 27) 38-HS. The logical low-side switch LS likewise contains, as explained with reference to FIGS. 22 and 23, at least one series 31-LS, 32-LS, 33-LS, 34-LS, 35-LS, 36-LS, 37-LS and 38-LS (these reference signs are not illustrated in FIG. 27 for reasons of clarity).

Furthermore, a plurality of second external terminals 102, which are electrically conductively connected to one another in the interior of the semiconductor module 100 and serve for connecting a negative DC supply voltage, are arranged one behind another in a line likewise extending in the second lateral direction r2. Moreover, a plurality of third external terminals 103, which are electrically conductively connected to one another in the interior of the semiconductor module 100 and serve for connecting an electrical load, are arranged one behind another in a line extending in the second lateral direction r2.

Insofar as first, second and third external terminals 101, 102 and 103, respectively, are present, these can be arranged on the outer side of a module housing in which the semiconductor chips 1, inter alia, are arranged. In any case the first, second and third external terminals 101, 102 and 103 respectively—if present—are accessible and thus electrically contactable from the outer side of the module housing.

If, during the operation of the semiconductor module 100, the logical low-side switch LS is turned off and the logical high-side switch HS is turned on, an electric current flows between the first external terminals 101 and the third external terminals 103, that is to say substantially parallel to the first lateral direction r1. Conversely, if the logical low-side switch LS is turned on and the logical high-side switch HS is turned off, an electric current flows between the second external terminals 102 and the third external terminals 103, that is to say likewise substantially parallel to the first lateral direction r1. The semiconductor chips 1 of each of the series 31-HS, 32-HS, 33-HS, 34-HS, 35-HS, 36-HS, 37-HS, 38-HS, 31-LS, 32-LS, 33-LS, 34-LS, 35-LS, 36-LS, 37-LS and 38-LS are therefore arranged one behind another in each case in the first lateral direction r1.

In other embodiments of a semiconductor module 100 that does not contain a half-bridge but rather only an individual component, two lines of external terminals running in each case in the second lateral direction r2 suffice. For example, it is then possible, as explained, for the first external terminals 101 to be electrically conductively connected to the first load terminals 11 of the semiconductor chips 1, and for the second external terminals 102 to be electrically conductively connected to the second load terminals 12 of said semiconductor chips.

Figure 28:
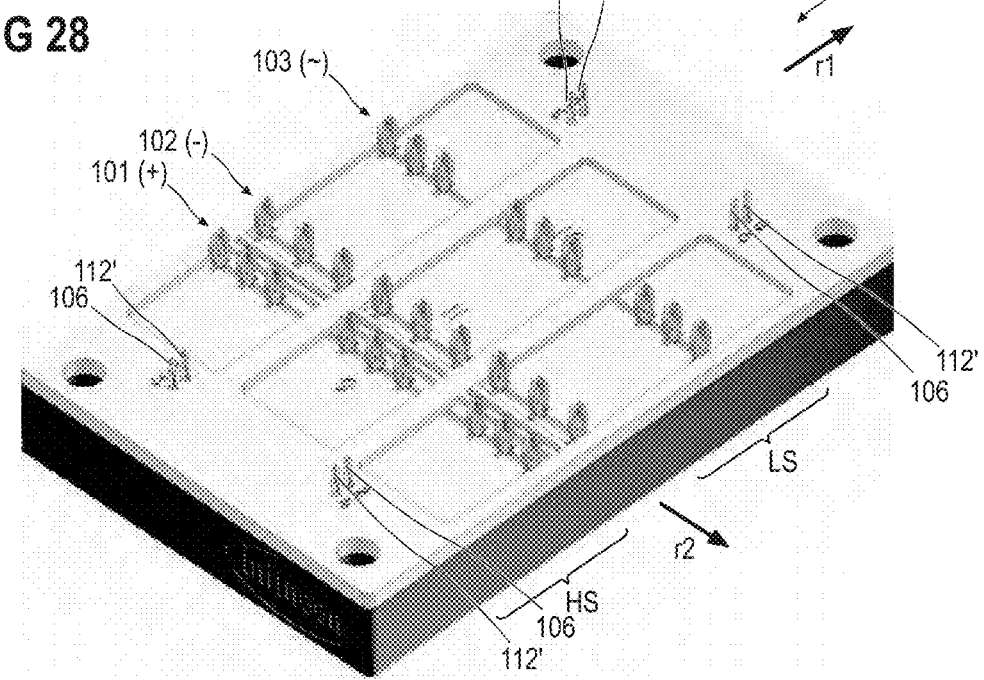

The semiconductor module 100 can additionally have, for each of its controllable logical individual switches (here: the logical low-side switch LS and the logical high-side switch HS), at least one pair of external terminals 106 and 112' via which a control signal can be fed to the relevant controllable logical individual switch LS, HS. For this purpose, per pair there is one external terminal 106 which is electrically conductively connected to the control terminals 13 of the controllable semiconductor chips 1 of the relevant logical individual switch LS, HS, for example via one or a plurality of bonding wires 6, and one external terminal 112' which is electrically conductively connected to the first load terminals 11 of the controllable semiconductor chips 1 of the relevant logical individual switch LS, HS, for example via one or a plurality of bonding wires 12' and the first load current collecting conductor track 71. The semiconductor module 100 in accordance with FIG. 27 has merely by way of example, both for the logical individual switch LS, and for the logical individual switch HS, in each case two of such pairs of external terminals 106, 112. FIG. 28 shows the semiconductor module 100 in accordance with FIG. 27 with a housing cover placed thereon.

Insofar as a power semiconductor module 100 comprises a half-bridge having a logical low-side switch LS and a logical high-side switch HS, the load paths of which are electrically connected in series (see, for example, FIGS. 22, 23 in conjunction with FIGS. 27 and 28), the first external terminals 101 serving for connecting a positive DC supply voltage and the second external terminals 102 serving for connecting a negative DC supply voltage can be arranged in the first lateral direction r1 in each case between the logical low-side switch LS and the logical high-side switch HS.

Generally, the present invention makes it possible to realize power semiconductor modules which contain only one or two or else more than two logical individual components, wherein each of the logical individual components contains a parallel connection of at least two semiconductor chips 1 which are arranged one behind another in one or a plurality of series 31, 32, 33, 34 etc., each of which extends in the first lateral direction r1 and in each of which at least two of the semiconductor chips 1 are arranged one behind another in the lateral direction r1. In this case, the first load terminals 11 of said semiconductor chips 1 are electrically conductively connected to one another, and the second load terminals 12 of said semiconductor chips 1 are electrically conductively connected to one another. If the semiconductor chips 1 are diodes, they have no control terminals 13. If the semiconductor chips 1 are otherwise controllable semiconductor components, they have a control terminal 13, which can optionally be electrically conductively connected to one another.

The number of the semiconductor chips 1 of a logical individual component that are electrically connected in parallel in the manner explained above is arbitrary, in principle. It can be for example at least 4, at least 8 or at least 16. The semiconductor chips 1 of such a logical individual component can be arranged in the form of an m×n matrix having m series 31, 32, 33, 34 etc. and n lines 21, 22, 23, 24 etc. on the circuit carrier 9. The m series 31, 32, 33, 34 etc. in each case run in the first lateral direction r1, and the n lines 21, 22, 23, 24 in each case run in the second lateral direction r2 perpendicular to the first lateral direction r1. As an alternative thereto, the first lateral direction r1 and the second lateral direction r2 can also form an angle of less than 90° and greater than 0°, for example of 45° or of 65°. The value m can be for example at least 2, at least 3, at least 4, or at least 8, and the value n, independently of m, can be for example at least 2, at least 4, or a maximum of 8. Optionally, m can be greater than or equal to n (m≥n), or greater than or equal to 2·n (m≥2n). The number of the semiconductor chips 1 that are arranged in such a matrix and electrically connected in parallel (e.g., to form a logical switch) can be for example at least 4 or at least 6.

Insofar as a semiconductor module 100 contains two or more logical individual components, the respective first lateral directions r1 thereof can run parallel. Likewise, the respective second lateral directions r2 thereof can run parallel, which is likewise illustrated in FIG. 27.

All of the electrically conductive connections explained in the description above can be embodied as permanently electrically conductive connections.

The present invention is suitable for electrically connecting in parallel a multiplicity of arbitrary semiconductor chips 1, in particular including small semiconductor chips 1. In this regard, optionally, each of a plurality of semiconductor chips 1 electrically connected in parallel to form a logical individual component can have a basic area of less than 40 mm$^2$ or of less than 25 mm$^2$ or of less than 10 mm$^2$.

The basic semiconductor material of the parallel-connected semiconductor chips 1 is arbitrary, in principle. The semiconductor chips 1 connected in parallel to form a logical individual component can comprise identical but also different basic semiconductor materials, for example silicon, silicon carbide, gallium nitride, gallium arsenide.

As is additionally illustrated in FIGS. 22 and 23, the first load terminals 11 of semiconductor chips 1 which are arranged in two adjacent series 31-HS and 32-HS, 33-HS and 34-HS, 35-HS and 36-HS, 37-HS and 38-HS, 31-LS and 32-LS, 33-LS and 34-LS, 35-LS and 36-LS, 37-LS and 38-LS can be connected to a common first load current collecting conductor track 71, arranged between the relevant series, in each case by means of one or a plurality of connection conductors 4.

In the case of the parallel connection of semiconductor chips 1 which are arranged one behind another in one or a plurality of series and in which both the first load terminal 11 and the second load terminal 12 are situated on that side of the relevant semiconductor body 10 which faces away from the first printed circuit board 7, the second load terminals 12 can be connected to the second load current collecting conductor track 72 according to the same principle as was explained above for the connection of the first load terminals 11 to the first load current collecting conductor track 71.

The invention claimed is:

1. A circuit arrangement comprising:
   a plurality of semiconductor chips arranged one behind another in a series extending in a first lateral direction, wherein
   each of the semiconductor chips has a semiconductor body, and also a first load terminal and a second load terminal;
   the first load terminals of all the semiconductor chips are electrically conductively connected to one another; and
   the second load terminals of all the semiconductor chips are electrically conductively connected to one another;
   a first load current collecting conductor rack adjacent to the plurality of semiconductor chips and extending in the first lateral direction;
   at least one electrical connection conductor electrically connecting each of the semiconductor chips in the plurality to the first load current collecting conductor track, wherein the at least one electrical connection conductor that electrically connects each of the semiconductor chips is electrically conductively connected to the first load terminal of each of the semiconductor chips at a first connection location and is electrically conductively connected to the first load current collecting conductor track at a second connection location; and
   an external terminal of the circuit arrangement, said external terminal being electrically conductively connected to the first load current collecting conductor track;
   wherein for each section of the first load current collecting conductor track that is between two directly adjacent second connection locations that electrically connect first and second semiconductor chips of the plurality to the first load current collecting conductor track, a total inductance of the section of the first load current collecting conductor track is less than half of an inductance of the electrical connection conductors that electrically connect the second semiconductor chip to first load current collecting conductor track,
   wherein the second connection location of the first semiconductor chip is closer to the external terminal than the second connection location of the second semiconductor chip.

2. The circuit arrangement as claimed in claim 1, wherein the ratio between the total inductance of all the connection conductors with which the first load terminal of the second of the semiconductor chips is connected to the first load current collecting conductor track has at least five times the inductance of the section formed between the second connection location of the first of the semiconductor chips and the second connection location of the second of the semiconductor chips.

3. The circuit arrangement as claimed in claim 1, wherein the ratio between the total inductance of all the connection conductors with which the first load terminal of the second of the semiconductor chips is connected to the first load current collecting conductor track has at least five times the inductance of the section formed between the second connection location of the first of the semiconductor chips and the second connection location of the second of the semiconductor chips.

4. The circuit arrangement as claimed in claim 1, wherein for one, a plurality or all of the sections of the first load current collecting conductor track which form directly adjacent second connection locations among the latter along the first load current collecting conductor track, the product of the inductance of the relevant section and the rated current of the semiconductor chip which is assigned to that one of the two directly adjacent second connection locations which is spaced apart further from the external terminal along the first load current collecting conductor track is less than 15 nVs.

5. The circuit arrangement as claimed in claim 1, wherein the inductance of the section formed between the second connection location of the first of the semiconductor chips and the second connection location of the second of the semiconductor chips is less than or equal to 1 nH.

6. The circuit arrangement as claimed in claim 1, wherein for each of the semiconductor chips the total inductance of all the connection conductors with which the first load terminal of said semiconductor chip is connected to the first load current collecting conductor track is greater than or equal to 2 and less than or equal to 10 nH.

7. The circuit arrangement as claimed in claim 1, wherein each of the electrical connection conductors is embodied as a bonding wire which is bonded directly to the first load terminal at the relevant first connection location and which is bonded directly to the first load current collecting conductor track at the relevant second connection location.

8. The circuit arrangement as claimed in claim 1, comprising a second load current collecting conductor track, wherein each of the semiconductor chips is arranged on the second load current collecting conductor track in such a way that its first load terminal is situated on that side of the semiconductor body which faces away from the second load current collecting conductor track, and its second load terminal is situated on that side of the semiconductor body which faces the second load current collecting conductor track.

9. The circuit arrangement as claimed in claim 1, wherein the first load current collecting conductor track has an elongate shape having a longitudinal direction which extends in the first lateral direction.

10. The circuit arrangement as claimed in claim 1, wherein the first load terminals of all the semiconductor chips are source terminals; or the first load terminals of all the semiconductor chips are emitter terminals.

11. The circuit arrangement as claimed in claim 1, wherein each of the semiconductor chips has a basic area of less than 40 mm$^2$ or less than 25 mm$^2$ or less than 10 mm$^2$.

12. The circuit arrangement as claimed in claim 1, comprising a circuit carrier, which comprises a first printed circuit board having a first insulation carrier embodied as a dielectric layer, and also having a first upper metalization layer and a first lower metalization layer, which are arranged on opposite sides of the first insulation carrier and are cohesively connected thereto.

13. The circuit arrangement as claimed in claim 12, wherein the first load current collecting conductor track is formed in the first upper metalization layer.

14. The circuit arrangement as claimed in claim 12, wherein the first load current collecting conductor track is arranged on that side of the first upper metalization layer which faces away from the insulation carrier; and a first dielectric layer is arranged between the first load current collecting conductor track and the first upper metalization layer.

15. The circuit arrangement as claimed in claim 14, wherein the first dielectric layer comprises one of the following materials or consists of one of the following materials: ceramic, glass, plastic, imide.

16. The circuit arrangement as claimed in claim 12, comprising a second printed circuit board, which is arranged on that side of the first upper metalization layer which faces away from the first insulation carrier, and which comprises a second insulation carrier embodied as a dielectric layer; and also a second upper metalization layer and a second lower metalization layer, which are arranged on opposite sides of the second insulation carrier and are cohesively connected thereto, wherein the second lower metalization layer is arranged between the second insulation carrier and the first upper metalization layer; and the first printed circuit board and the second printed circuit board are cohesively connected to one another by a connection layer adjoining both the first upper metalization layer and the second lower metalization layer.

17. The circuit arrangement as claimed in claim 16, wherein the first insulation carrier comprises ceramic or consists of ceramic; and the second insulation carrier comprises ceramic or consists of ceramic.

18. The circuit arrangement as claimed in claim 1, wherein each of the semiconductor chips has a control terminal, via which a load path formed between the first load terminal and the second load terminal of the relevant semiconductor chip can be controlled; and all of said control terminals are electrically conductively connected to one another.

19. The circuit arrangement as claimed in claim 18, comprising a control signal conductor track, which is electrically conductively connected to the control terminals.

20. The circuit arrangement as claimed in claim 19, comprising a circuit carrier, which comprises a first printed circuit board having a first insulation carrier embodied as a dielectric layer, and also having a first upper metalization layer and a first lower metalization layer, which are arranged on opposite sides of the first insulation carrier and are cohesively connected thereto, wherein the control signal conductor track is formed in the upper metalization layer.

21. The circuit arrangement as claimed in claim 18, comprising a control signal conductor track, which is electrically conductively connected to the control terminals, wherein the control signal conductor track is formed on that side of an upper metalization layer which faces away from an insulation carrier; and a second dielectric layer is arranged between the control signal conductor track and the upper metalization layer.

22. The circuit arrangement as claimed in claim 21, wherein the second dielectric layer comprises one of the following materials or consists of one of the following materials: ceramic, glass, plastic, imide.

23. The circuit arrangement as claimed in claim 19, wherein the control signal conductor track is arranged between two directly adjacent series among the latter; and a bonding wire which connects the control terminals of all the semiconductor chips of the two directly adjacent series among the latter to a common terminal is bonded to the control signal conductor rack at a location situated centrally between the semiconductor chips of the two directly adjacent series among the latter.

24. A circuit arrangement comprising a first circuit arrangement as claimed in claim 1 and a second circuit arrangement embodied as claimed in claim 1, wherein the first load terminals of the semiconductor chips of the first circuit arrangement are permanently electrically conductively connected to the second load terminals of the semiconductor chips of the second circuit arrangement.

25. The circuit arrangement as claimed in claim 24, wherein the first lateral direction of the first circuit arrangement is identical to the first lateral direction of the second circuit arrangement.

26. The circuit arrangement as claimed in claim 24, comprising:

a housing;

a plurality of first external terminals which are electrically conductively connected to one another and also to the second load terminals of the semiconductor chips of the firm circuit arrangement in the interior of the housing and which are arranged one behind another in a first line;

a plurality of second external terminals which are electrically conductively connected to one another and also to the first load terminals of the semiconductor chips of the second circuit arrangement in the interior of the housing and which are arranged one behind another in a second line; and a plurality of third external terminals which are electrically conductively connected to one another and also to the first load terminals of the semiconductor chips of the first circuit arrangement and the second load terminals of the semiconductor chips of the second circuit arrangement in the interior of the housing and which are arranged one behind another in a third line.

27. The circuit arrangement as claimed in claim 26, wherein the first line, the second line and the third line in each case run perpendicular to the first lateral direction of the first circuit arrangement.

* * * * *

UNITED STATES PATENT AND TRADEMARK OFFICE
CERTIFICATE OF CORRECTION

PATENT NO. : 9,659,912 B2  
APPLICATION NO. : 14/830446  
DATED : May 23, 2017  
INVENTOR(S) : R. Bayerer et al.

Page 1 of 1

It is certified that error appears in the above-identified patent and that said Letters Patent is hereby corrected as shown below:

On the Title Page

Abstract (Line 2), please change "chip" to -- chips --.

In the Claims

Column 23, Line 40 (Claim 1, Line 12), please change "rack" to -- track --.
Column 24, Line 45 (Claim 6, Line 6), please change "2 and" to -- 2 nH and --.
Column 26, Line 26 (Claim 23, Line 8), please change "rack" to -- track --.
Column 26, Line 46 (Claim 26, Line 7), please change "firm" to -- first --.

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*